US009117866B2

(12) United States Patent
Marquardt et al.

(10) Patent No.: US 9,117,866 B2
(45) Date of Patent: Aug. 25, 2015

(54) APPARATUS AND METHOD FOR CALCULATING A WAFER POSITION IN A PROCESSING CHAMBER UNDER PROCESS CONDITIONS

(75) Inventors: David Marquardt, Scottsdale, AZ (US); John Shugrue, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 302 days.

(21) Appl. No.: 13/563,066

(22) Filed: Jul. 31, 2012

(65) Prior Publication Data

US 2014/0036274 A1 Feb. 6, 2014

(51) Int. Cl.
*G01B 11/14* (2006.01)
*H01L 21/68* (2006.01)
*F27D 3/00* (2006.01)
*H01L 21/67* (2006.01)

(52) U.S. Cl.
CPC ............ *H01L 21/681* (2013.01); *F27D 3/0084* (2013.01); *G01B 11/14* (2013.01); *H01L 21/67259* (2013.01)

(58) Field of Classification Search
CPC .................. C23C 16/45544; C23C 16/45551; C23C 16/4583; C23C 16/4584; C23C 16/4585; G03F 7/70691; G03F 7/70775; G03F 7/70716; G03F 7/70758; C30B 25/12
USPC ...................... 356/237.1–241.6, 242.1–243.8, 356/426–431, 600–640
See application file for complete search history.

(56) References Cited

U.S. PATENT DOCUMENTS

| | | |
|---|---|---|
| 2,745,640 A | 5/1956 | Cushman |
| 2,990,045 A | 9/1959 | Root |
| 3,833,492 A | 9/1974 | Bollyky |
| 3,854,443 A | 12/1974 | Baerg |
| 3,862,397 A | 1/1975 | Anderson et al. |
| 3,887,790 A | 6/1975 | Ferguson |
| 4,058,430 A | 11/1977 | Suntola et al. |
| 4,176,630 A | 12/1979 | Elmer |
| 4,194,536 A | 3/1980 | Stine et al. |
| 4,322,592 A | 3/1982 | Martin |
| 4,389,973 A | 6/1983 | Suntola et al. |
| 4,393,013 A | 7/1983 | McMenamin |
| 4,436,674 A | 3/1984 | McMenamin |
| 4,499,354 A | 2/1985 | Hill et al. |

(Continued)

FOREIGN PATENT DOCUMENTS

| CN | 1563483 A | 12/2006 |
|---|---|---|
| CN | 101330015 | 12/2008 |

(Continued)

OTHER PUBLICATIONS

USPTO; Final Office Action dated Jun. 28, 2013 in U.S. Appl. No. 12/754,223.

(Continued)

*Primary Examiner* — Michael A Lyons
*Assistant Examiner* — Jarreas C Underwood
(74) *Attorney, Agent, or Firm* — Snell & Wilmer LLP

(57) ABSTRACT

An apparatus for processing a wafer including a reaction chamber having a reaction space for processing the wafer, a susceptor positioned within the reaction chamber and having a sidewall, at least one light source positioned outside of the reaction space, at least one window in the reaction chamber, and wherein the at least one light source is directed through the at least one window to contact the sidewall.

28 Claims, 15 Drawing Sheets

(56) References Cited

U.S. PATENT DOCUMENTS

| | | |
|---|---|---|
| 4,512,113 A | 4/1985 | Budinger |
| 4,570,328 A | 2/1986 | Price et al. |
| D288,556 S | 3/1987 | Wallgren |
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,789,294 A * | 12/1988 | Sato et al. .............. 414/416.03 |
| 4,821,674 A * | 4/1989 | deBoer et al. ................ 118/666 |
| 4,827,430 A | 5/1989 | Aid et al. |
| 4,882,199 A | 11/1989 | Sadoway et al. |
| 4,986,215 A | 1/1991 | Yamada |
| 4,991,614 A | 2/1991 | Hammel |
| 5,062,386 A | 11/1991 | Christensen |
| 5,074,017 A | 12/1991 | Toya et al. |
| 5,119,760 A | 6/1992 | McMillan et al. |
| 5,167,716 A | 12/1992 | Boitnott et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A * | 9/1993 | Nishi ........................ 250/548 |
| 5,326,427 A | 7/1994 | Jerbic |
| 5,380,367 A | 1/1995 | Bertone |
| 5,421,893 A | 6/1995 | Perlov |
| 5,422,139 A | 6/1995 | Fischer |
| 5,518,549 A | 5/1996 | Hellwig |
| 5,595,606 A | 1/1997 | Fujikawa et al. |
| 5,632,919 A | 5/1997 | MacCracken et al. |
| 5,681,779 A | 10/1997 | Pasch et al. |
| 5,695,567 A | 12/1997 | Kordina |
| 5,730,801 A | 3/1998 | Tepman |
| 5,732,744 A | 3/1998 | Barr et al. |
| 5,736,314 A | 4/1998 | Hayes et al. |
| 5,796,074 A | 8/1998 | Edelstein et al. |
| 5,836,483 A | 11/1998 | Disel |
| 5,837,320 A | 11/1998 | Hampden-Smith et al. |
| 5,855,680 A | 1/1999 | Soininen et al. |
| 5,920,798 A | 7/1999 | Higuchi et al. |
| 5,979,506 A | 11/1999 | Aarseth |
| 6,013,553 A | 1/2000 | Wallace |
| 6,015,465 A | 1/2000 | Kholodenko et al. |
| 6,035,101 A | 3/2000 | Sajoto et al. |
| 6,060,691 A | 5/2000 | Minami et al. |
| 6,074,443 A | 6/2000 | Venkatesh |
| 6,083,321 A | 7/2000 | Lei et al. |
| 6,086,677 A | 7/2000 | Umotoy et al. |
| 6,122,036 A * | 9/2000 | Yamasaki et al. ............... 355/53 |
| 6,125,789 A * | 10/2000 | Gupta et al. ............... 118/723 E |
| 6,129,044 A | 10/2000 | Zhao et al. |
| 6,148,761 A | 11/2000 | Majewski et al. |
| 6,160,244 A | 12/2000 | Ohashi |
| 6,161,500 A | 12/2000 | Kopacz et al. |
| 6,201,999 B1 | 3/2001 | Jevtic |
| 6,274,878 B1 * | 8/2001 | Li et al. ........................ 250/548 |
| 6,287,965 B1 | 9/2001 | Kang et al. |
| 6,302,964 B1 | 10/2001 | Umotoy et al. |
| 6,312,525 B1 | 11/2001 | Bright et al. |
| D451,893 S | 12/2001 | Robson |
| D452,220 S | 12/2001 | Robson |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,383,566 B1 | 5/2002 | Zagdoun |
| 6,410,459 B2 | 6/2002 | Blalock et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,521,295 B1 | 2/2003 | Remington |
| 6,534,395 B2 | 3/2003 | Werkhoven et al. |
| 6,569,239 B2 * | 5/2003 | Arai et al. ........................ 117/89 |
| 6,579,833 B1 | 6/2003 | McNallan et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,633,364 B2 * | 10/2003 | Hayashi ........................ 355/53 |
| 6,645,304 B2 | 11/2003 | Yamaguchi |
| 6,648,974 B1 * | 11/2003 | Ogliari et al. ................ 118/719 |
| 6,673,196 B1 | 1/2004 | Oyabu |
| 6,682,973 B1 | 1/2004 | Paton et al. |
| 6,709,989 B2 | 3/2004 | Ramdani et al. |
| 6,710,364 B2 * | 3/2004 | Guldi et al. .............. 250/559.44 |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,847,014 B1 | 1/2005 | Benjamin et al. |
| 6,858,524 B2 | 2/2005 | Haukka et al. |
| 6,858,547 B2 | 2/2005 | Metzner |
| 6,863,019 B2 | 3/2005 | Shamouilian |
| 6,874,480 B1 | 4/2005 | Ismailov |
| 6,875,677 B1 | 4/2005 | Conley, Jr. et al. |
| 6,884,066 B2 | 4/2005 | Nguyen et al. |
| 6,884,319 B2 | 4/2005 | Kim |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 6,955,836 B2 | 10/2005 | Kumagai et al. |
| 6,972,478 B1 | 12/2005 | Waite et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| D553,104 S | 10/2007 | Oohashi et al. |
| 7,298,009 B2 | 11/2007 | Yan et al. |
| D557,226 S | 12/2007 | Uchino et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,418 B2 | 7/2008 | Yokogawa |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,437,060 B2 | 10/2008 | Wang et al. |
| 7,442,275 B2 | 10/2008 | Cowans |
| 7,489,389 B2 * | 2/2009 | Shibazaki ........................ 355/75 |
| D593,969 S | 6/2009 | Li |
| 7,547,363 B2 | 6/2009 | Tomiyasu et al. |
| 7,575,968 B2 | 8/2009 | Sadaka et al. |
| 7,601,223 B2 | 10/2009 | Lindfors et al. |
| 7,601,225 B2 | 10/2009 | Tuominen et al. |
| 7,640,142 B2 * | 12/2009 | Tachikawa et al. ........... 702/197 |
| 7,651,583 B2 | 1/2010 | Kent et al. |
| D609,655 S | 2/2010 | Sugimoto |
| 7,678,197 B2 | 3/2010 | Maki |
| D614,153 S | 4/2010 | Fondurulia et al. |
| 7,720,560 B2 | 5/2010 | Menser et al. |
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,851,019 B2 | 12/2010 | Tuominen et al. |
| 7,884,918 B2 * | 2/2011 | Hattori ........................ 355/52 |
| D634,719 S | 3/2011 | Yasuda et al. |
| 8,041,197 B2 | 10/2011 | Kasai et al. |

(56) References Cited

U.S. PATENT DOCUMENTS

| | | | |
|---|---|---|---|
| 8,055,378 B2 | 11/2011 | Numakura | |
| 8,071,451 B2 | 12/2011 | Berry | |
| 8,071,452 B2 | 12/2011 | Raisanen | |
| 8,072,578 B2 * | 12/2011 | Yasuda et al. | 355/55 |
| 8,076,230 B2 | 12/2011 | Wei | |
| 8,076,237 B2 | 12/2011 | Uzoh | |
| 8,082,946 B2 | 12/2011 | Laverdiere et al. | |
| 8,092,604 B2 | 1/2012 | Tomiyasu et al. | |
| 8,137,462 B2 | 3/2012 | Fondurulia et al. | |
| 8,147,242 B2 | 4/2012 | Shibagaki et al. | |
| 8,216,380 B2 | 7/2012 | White et al. | |
| 8,278,176 B2 | 10/2012 | Bauer et al. | |
| 8,282,769 B2 | 10/2012 | Iizuka | |
| 8,287,648 B2 | 10/2012 | Reed et al. | |
| 8,293,016 B2 | 10/2012 | Bahng et al. | |
| 8,309,173 B2 | 11/2012 | Tuominen et al. | |
| 8,323,413 B2 | 12/2012 | Son | |
| 8,367,528 B2 | 2/2013 | Bauer et al. | |
| 8,372,204 B2 | 2/2013 | Nakamura | |
| 8,444,120 B2 | 5/2013 | Gregg et al. | |
| 8,506,713 B2 | 8/2013 | Takagi | |
| D691,974 S | 10/2013 | Osada et al. | |
| 8,608,885 B2 | 12/2013 | Goto et al. | |
| D705,745 S | 5/2014 | Kurs et al. | |
| 8,726,837 B2 * | 5/2014 | Patalay et al. | 118/713 |
| 8,728,832 B2 | 5/2014 | Raisanen et al. | |
| 8,802,201 B2 | 8/2014 | Raisanen et al. | |
| D716,742 S | 11/2014 | Jang et al. | |
| 8,877,655 B2 | 11/2014 | Shero et al. | |
| 8,883,270 B2 | 11/2014 | Shero et al. | |
| 8,986,456 B2 | 3/2015 | Fondurulia et al. | |
| 8,993,054 B2 | 3/2015 | Jung et al. | |
| 9,005,539 B2 | 4/2015 | Halpin et al. | |
| 9,017,481 B1 | 4/2015 | Pettinger et al. | |
| 9,018,111 B2 | 4/2015 | Milligan et al. | |
| 9,021,985 B2 | 5/2015 | Alokozai et al. | |
| 9,029,253 B2 | 5/2015 | Milligan et al. | |
| 2001/0017103 A1 | 8/2001 | Takeshita et al. | |
| 2001/0046765 A1 | 11/2001 | Cappellani et al. | |
| 2002/0001974 A1 | 1/2002 | Chan | |
| 2002/0011210 A1 | 1/2002 | Satoh et al. | |
| 2002/0064592 A1 | 5/2002 | Datta et al. | |
| 2002/0098627 A1 | 7/2002 | Pomarede et al. | |
| 2002/0108670 A1 | 8/2002 | Baker et al. | |
| 2002/0115252 A1 | 8/2002 | Haukka et al. | |
| 2002/0172768 A1 | 11/2002 | Endo et al. | |
| 2002/0187650 A1 | 12/2002 | Blalock et al. | |
| 2003/0019580 A1 | 1/2003 | Strang | |
| 2003/0025146 A1 | 2/2003 | Narwankar et al. | |
| 2003/0040158 A1 | 2/2003 | Saitoh | |
| 2003/0042419 A1 * | 3/2003 | Katsumata et al. | 250/339.11 |
| 2003/0066826 A1 | 4/2003 | Lee et al. | |
| 2003/0075925 A1 | 4/2003 | Lindfors et al. | |
| 2003/0094133 A1 | 5/2003 | Yoshidome et al. | |
| 2003/0111963 A1 | 6/2003 | Tolmachev et al. | |
| 2003/0141820 A1 | 7/2003 | White et al. | |
| 2003/0228772 A1 | 12/2003 | Cowans | |
| 2003/0232138 A1 | 12/2003 | Tuominen et al. | |
| 2004/0013577 A1 | 1/2004 | Ganguli et al. | |
| 2004/0023516 A1 | 2/2004 | Londergan et al. | |
| 2004/0036129 A1 | 2/2004 | Forbes et al. | |
| 2004/0077182 A1 | 4/2004 | Lim et al. | |
| 2004/0106249 A1 | 6/2004 | Huotari | |
| 2004/0144980 A1 | 7/2004 | Ahn et al. | |
| 2004/0168627 A1 | 9/2004 | Conley et al. | |
| 2004/0169032 A1 | 9/2004 | Murayama et al. | |
| 2004/0198069 A1 | 10/2004 | Metzner et al. | |
| 2004/0200499 A1 | 10/2004 | Harvey et al. | |
| 2004/0219793 A1 | 11/2004 | Hishiya et al. | |
| 2004/0221807 A1 | 11/2004 | Verghese et al. | |
| 2004/0266011 A1 | 12/2004 | Lee et al. | |
| 2005/0008799 A1 | 1/2005 | Tomiyasu et al. | |
| 2005/0019026 A1 | 1/2005 | Wang et al. | |
| 2005/0020071 A1 | 1/2005 | Sonobe et al. | |
| 2005/0023624 A1 | 2/2005 | Ahn et al. | |
| 2005/0054228 A1 | 3/2005 | March | |
| 2005/0066893 A1 | 3/2005 | Soininen | |
| 2005/0070123 A1 | 3/2005 | Hirano | |
| 2005/0072357 A1 | 4/2005 | Shero et al. | |
| 2005/0092249 A1 | 5/2005 | Kilpela et al. | |
| 2005/0100669 A1 | 5/2005 | Kools et al. | |
| 2005/0106893 A1 | 5/2005 | Wilk | |
| 2005/0110069 A1 | 5/2005 | Kil et al. | |
| 2005/0173003 A1 | 8/2005 | Laverdiere et al. | |
| 2005/0187647 A1 | 8/2005 | Wang et al. | |
| 2005/0212119 A1 | 9/2005 | Shero | |
| 2005/0214457 A1 | 9/2005 | Schmitt et al. | |
| 2005/0214458 A1 | 9/2005 | Meiere | |
| 2005/0218462 A1 | 10/2005 | Ahn et al. | |
| 2005/0229848 A1 | 10/2005 | Shinriki | |
| 2005/0229972 A1 | 10/2005 | Hoshi et al. | |
| 2005/0241176 A1 | 11/2005 | Shero et al. | |
| 2005/0263075 A1 | 12/2005 | Wang et al. | |
| 2005/0271813 A1 | 12/2005 | Kher et al. | |
| 2005/0282101 A1 | 12/2005 | Adachi | |
| 2006/0013946 A1 | 1/2006 | Park et al. | |
| 2006/0014384 A1 | 1/2006 | Lee et al. | |
| 2006/0019033 A1 | 1/2006 | Muthukrishnan et al. | |
| 2006/0024439 A2 | 2/2006 | Tuominen et al. | |
| 2006/0046518 A1 | 3/2006 | Hill et al. | |
| 2006/0051925 A1 | 3/2006 | Ahn et al. | |
| 2006/0060930 A1 | 3/2006 | Metz et al. | |
| 2006/0062910 A1 | 3/2006 | Meiere | |
| 2006/0063346 A1 | 3/2006 | Lee et al. | |
| 2006/0068125 A1 | 3/2006 | Radhakrishnan | |
| 2006/0110934 A1 | 5/2006 | Fukuchi | |
| 2006/0113675 A1 | 6/2006 | Chang et al. | |
| 2006/0128168 A1 | 6/2006 | Ahn et al. | |
| 2006/0148180 A1 | 7/2006 | Ahn et al. | |
| 2006/0193979 A1 | 8/2006 | Meiere et al. | |
| 2006/0208215 A1 | 9/2006 | Metzner et al. | |
| 2006/0213439 A1 | 9/2006 | Ishizaka | |
| 2006/0223301 A1 | 10/2006 | Vanhaelemeersch et al. | |
| 2006/0226117 A1 | 10/2006 | Bertram et al. | |
| 2006/0228888 A1 | 10/2006 | Lee et al. | |
| 2006/0240574 A1 | 10/2006 | Yoshie | |
| 2006/0257563 A1 | 11/2006 | Doh et al. | |
| 2006/0258078 A1 | 11/2006 | Lee et al. | |
| 2006/0266289 A1 | 11/2006 | Verghese et al. | |
| 2007/0010072 A1 | 1/2007 | Bailey et al. | |
| 2007/0020953 A1 | 1/2007 | Tsai et al. | |
| 2007/0022954 A1 | 2/2007 | Iizuka et al. | |
| 2007/0028842 A1 | 2/2007 | Inagawa et al. | |
| 2007/0031598 A1 | 2/2007 | Okuyama et al. | |
| 2007/0031599 A1 | 2/2007 | Gschwandtner et al. | |
| 2007/0037412 A1 | 2/2007 | Dip et al. | |
| 2007/0042117 A1 | 2/2007 | Kupurao et al. | |
| 2007/0049053 A1 | 3/2007 | Mahajani | |
| 2007/0059948 A1 | 3/2007 | Metzner et al. | |
| 2007/0065578 A1 | 3/2007 | McDougall | |
| 2007/0066010 A1 | 3/2007 | Ando | |
| 2007/0077355 A1 | 4/2007 | Chacin et al. | |
| 2007/0084405 A1 | 4/2007 | Kim | |
| 2007/0116873 A1 | 5/2007 | Li et al. | |
| 2007/0134942 A1 | 6/2007 | Ahn et al. | |
| 2007/0146621 A1 * | 6/2007 | Yeom | 349/187 |
| 2007/0155138 A1 | 7/2007 | Tomasini et al. | |
| 2007/0163440 A1 | 7/2007 | Kim et al. | |
| 2007/0166457 A1 | 7/2007 | Yamoto et al. | |
| 2007/0175397 A1 | 8/2007 | Tomiyasu et al. | |
| 2007/0209590 A1 | 9/2007 | Li | |
| 2007/0232501 A1 | 10/2007 | Tonomura | |
| 2007/0249131 A1 | 10/2007 | Allen et al. | |
| 2007/0252244 A1 | 11/2007 | Srividya et al. | |
| 2007/0264807 A1 | 11/2007 | Leone et al. | |
| 2008/0006208 A1 | 1/2008 | Ueno et al. | |
| 2008/0029790 A1 | 2/2008 | Ahn et al. | |
| 2008/0054332 A1 | 3/2008 | Kim et al. | |
| 2008/0057659 A1 | 3/2008 | Forbes et al. | |
| 2008/0075881 A1 | 3/2008 | Won et al. | |
| 2008/0085226 A1 | 4/2008 | Fondurulia et al. | |
| 2008/0113096 A1 | 5/2008 | Mahajani | |
| 2008/0113097 A1 | 5/2008 | Mahajani et al. | |
| 2008/0124908 A1 | 5/2008 | Forbes et al. | |

(56) References Cited

U.S. PATENT DOCUMENTS

| | | |
|---|---|---|
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0248310 A1 | 10/2008 | Kim et al. |
| 2008/0261413 A1 | 10/2008 | Mahajani |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1 | 1/2009 | Yamashita et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0093094 A1 | 4/2009 | Ye et al. |
| 2009/0095221 A1 | 4/2009 | Tam et al. |
| 2009/0107404 A1* | 4/2009 | Ogliari et al. ............... 118/729 |
| 2009/0122293 A1* | 5/2009 | Shibazaki .................... 355/73 |
| 2009/0136668 A1 | 5/2009 | Gregg et al. |
| 2009/0139657 A1 | 6/2009 | Lee et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2009/0289300 A1 | 11/2009 | Sasaki et al. |
| 2010/0024727 A1 | 2/2010 | Kim et al. |
| 2010/0025796 A1 | 2/2010 | Dabiran |
| 2010/0055312 A1* | 3/2010 | Kato et al. ............... 427/255.26 |
| 2010/0075507 A1 | 3/2010 | Chang et al. |
| 2010/0102417 A1 | 4/2010 | Ganguli et al. |
| 2010/0124610 A1* | 5/2010 | Aikawa et al. ........... 427/255.28 |
| 2010/0130017 A1 | 5/2010 | Luo et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1* | 3/2011 | Ganguly et al. ......... 156/345.27 |
| 2011/0070380 A1 | 3/2011 | Shero et al. |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070136 A1 | 3/2012 | Koelmel et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0270393 A1 | 10/2012 | Pore et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2012/0321786 A1 | 12/2012 | Satitpunwaycha et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0115383 A1 | 5/2013 | Lu et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2014/0000843 A1 | 1/2014 | Dunn et al. |
| 2014/0014644 A1 | 1/2014 | Akiba et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0084341 A1 | 3/2014 | Weeks |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |
| 2014/0251953 A1 | 9/2014 | Winkler et al. |
| 2014/0251954 A1 | 9/2014 | Winkler et al. |
| 2014/0346650 A1 | 11/2014 | Raisanen et al. |
| 2015/0004316 A1 | 1/2015 | Thompson et al. |
| 2015/0024609 A1 | 1/2015 | Milligan et al. |
| 2015/0048485 A1 | 2/2015 | Tolle |
| 2015/0091057 A1 | 4/2015 | Xie et al. |
| 2015/0096973 A1 | 4/2015 | Dunn et al. |
| 2015/0140210 A1 | 5/2015 | Jung et al. |
| 2015/0147877 A1 | 5/2015 | Jung |

FOREIGN PATENT DOCUMENTS

| | | |
|---|---|---|
| CN | 101522943 | 9/2009 |
| CN | 101423937 A | 9/2011 |
| JP | 07283149 | 10/1995 |
| JP | 08335558 | 12/1996 |
| JP | 2001342570 | 12/2001 |
| JP | 2004014952 A | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | I226380 | 1/2005 |
| TW | 200701301 A | 1/2007 |
| WO | 2006/056091 A1 | 6/2006 |
| WO | 2006/078666 | 7/2006 |

OTHER PUBLICATIONS

USPTO; Office Action dated Feb. 25, 2014 in U.S. Appl. No. 12/754,223.

USPTO; Restriction Requirement dated Sep. 25, 2012 in U.S. Appl. No. 12/854,818.

USPTO; Office Action dated Dec. 6, 2012 in U.S. Appl. No. 12/854,818.

USPTO; Final Office Action dated Mar. 13, 2013 in U.S. Appl. No. 12/854,818.

USPTO; Office Action dated Aug. 30, 2013 in U.S. Appl. No. 12/854,818.

USPTO; Final Office Action dated Mar. 26, 2014 in U.S. Appl. No. 12/854,818.

USPTO; Restriction Requirement dated May 8, 2013 in U.S. Appl. No. 13/102,980.

USPTO; Office Action dated Oct. 7, 2013 in U.S. Appl. No. 13/102,980.

USPTO; Final Office Action dated Mar. 25, 2014 in U.S. Appl. No. 13/102,980.

USPTO; Restriction Requirement dated Dec. 16, 2013 in U.S. Appl. No. 13/284,642.

USPTO; Restriction Requirement dated Apr. 21, 2014 in U.S. Appl. No. 13/284,642.

USPTO; Office Action dated Jan. 28, 2014 in U.S. Appl. No. 13/312,591.

USPTO; Final Office Action dated May 14, 2014 in U.S. Appl. No. 13/312,591.

(56) References Cited

OTHER PUBLICATIONS

USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
USPTO; Office Action dated Apr. 23, 2013 in U.S. Appl. No. 12/763,037.
USPTO; Office Action dated Jan. 15, 2013 in U.S. Appl. No. 12/754,223.
USPTO; Office Action dated Feb. 26, 2013 in U.S. Appl. No. 12/754,223.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 is Serial No. 201080015699.9.
Novaro et al. Theoretical Study on a Reaction Pathway of Ziegler-Natta-Type Catalysis, J. Chem. Phys. 68(5), Mar. 1, 1978 p. 2337-2351.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTa1-xN Alloys of Rocksalt Structure. Journal of Applied Physics, 110, pp. 043535-1-043535-6, (2011).
USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO; Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.

(56) References Cited

OTHER PUBLICATIONS

USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
USPTO; Final Office Action dated Apr. 15, 2015 in U.S. Appl. No. 13/187,300.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Final Office Action dated Mar. 13, 2015 in U.S. Appl. No. 13/597,043.
USPTO; Final Office Action dated Jun. 1, 2015 in U.S. Appl. No. 13/597,108.
USPTO; Non-Final Office Action dated May 28, 2015 in U.S. Appl. No. 13/651,144.
USPTO; Non-Final Office Action dated Apr. 3, 2015 in U.S. Appl. No. 13/677,133.
USPTO; Final Office Action dated Mar. 25, 2015 in U.S. Appl. No. 13/791,246.
USPTO; Notice of Allowance dated Mar. 10, 2015 in U.S. Appl. No. 13/874,708.
USPTO; Restriction Requirement dated Apr. 30, 2015 in U.S. Appl. No. 13/941,216.
USPTO; Non-Final Office Action dated Apr. 7, 2015 in U.S. Appl. No. 14/018,345.
USPTO; Non-Final Office Action dated Apr. 28, 2015 in U.S. Appl. No. 14/040,196.
USPTO; Non-Final Office Action dated Mar. 19, 2015 in U.S. Appl. No. 14/079,302.
USPTO; Non-Final Office Action dated Mar. 19, 2015 in U.S. Appl. No. 14/166,462.
USPTO; Non-Final Office Action dated Mar. 16, 2015 in U.S. Appl. No. 14/183,187.
USPTO; Non-Final Office Action dated Mar. 16, 2015 in U.S. Appl. No. 29/447,298.
Bearzotti, et al., "Fast Humidity Response of a Metal Halide-Doped Novel Polymer," Sensors and Actuators B, 7, pp. 451-454, (1992).
Crowell, "Chemical methods of thin film deposition: Chemical vapor deposition, atomic layer deposition, and related technologies," Journal of Vacuum Science & Technology A 21.5, (2003): S88-S95.
Varma, et al., "Effect of Metal Halides on Thermal, Mechanical, and Electrical Properties of Polypyromelitimide Films," Journal of Applied Polymer Science, vol. 32, pp. 3987-4000, (1986).

\* cited by examiner

APPARATUS AND METHOD FOR CALCULATING A WAFER POSITION IN A PROCESSING CHAMBER UNDER PROCESS CONDITIONS

FIELD OF THE DISCLOSURE

This disclosure relates generally to semiconductor processing, and more particularly to an apparatus and method for determining an offset position for a wafer within a processing chamber.

BACKGROUND

Semiconductor fabrication processes are typically conducted with the substrates supported within a chamber under controlled conditions. For many purposes, semiconductor substrates (e.g., wafers) are heated inside the process chamber. For example, substrates can be heated by direct physical contact with an internally heated wafer holder or "chuck." "Susceptors" are wafer supports used in systems where the wafer and susceptors absorb heat.

Some of the important controlled conditions for processing include, but are not limited to, fluid flow rate into the chamber, temperature of the reaction chamber, temperature of the fluid flowing into the reaction chamber, and wafer position on the susceptor during wafer loading.

Heating within the reaction chamber can occur in a number of ways, including lamp banks or arrays positioned above the substrate surface for directly heating the susceptor or susceptor heaters/pedestal heaters positioned below the susceptor. Traditionally, the pedestal style heater extends into the chamber through a bottom wall and the susceptor is mounted on a top surface of the heater. The heater may include a resistive heating element enclosed within the heater to provide conductive heat and increase the susceptor temperature.

A wafer is generally processed at a temperature significantly above room temperature, thereby requiring a significant heat ramp up and ramp down window. A wafer center position is traditionally found by fitting a unique reactor lid having an opening to see the wafer position. The operator will heat the chamber to some temperature below a processing temperature, usually around 200 degrees C. and perform several load and unload steps to determine where the proper wafer loading point is. Next, the operator will cool the chamber under vacuum and then further cool after backfilling to atmospheric pressures. All of these steps and procedures can take more time than is desired.

SUMMARY

Various aspects and implementations are disclosed herein that relate to substrate support assembly designs and methods for calculating a wafer position within a reaction chamber. In one aspect, an apparatus for processing a wafer may include a reaction chamber having a reaction space for processing the wafer; a susceptor positioned within the reaction chamber and having a sidewall, at least one light source positioned outside of the reaction space, at least one window in the reaction chamber, and wherein the at least one light source is directed through the at least one window to contact the sidewall.

In an implementation, the at least one light source may be a laser. The at least one light source may be three light sources. The at least one window may be three windows. The at least one window may be composed of quartz. The at least one light source may measure a position of the susceptor sidewall. The at least one light source may be mounted on an outer surface of the reaction chamber.

The at least one light source may be adjustable along a vertical axis. The at least one light source may measure a position of the susceptor sidewall when the susceptor is in a first vertical position and a position of a test wafer sidewall when the susceptor is in a second vertical position. The position of the susceptor sidewall may be compared to the position of the test wafer sidewall to define a relative offset. The relative offset may be a wafer center point. The wafer handler may position a wafer for processing according to the relative offset.

The at least one light source may operate at a processing temperature to determine a position of the susceptor sidewall at the processing temperature. The at least one light source may be removable. The at least one light source may be calibrated prior to being mounted on the reaction chamber. The apparatus may further include a test wafer, wherein the test wafer may be composed of a high opacity material and may include a generally straight sidewall. The test wafer may further include an opaque top surface.

In another aspect, a method for determining a wafer center point including the steps of providing a reaction chamber having a reaction space and a sidewall with a window, calibrating at least one light source, mounting the at least one light source to the sidewall, heating the reaction chamber to a processing temperature, activating the at least one light source, and calculating a position of the susceptor.

In an implementation, the method may include the steps of moving the susceptor vertically and activating the at least one light source to calculate a position of a test wafer. The method may include the step of calculating a wafer center point from the position of the test wafer and the position of the susceptor. The method may further include positioning a processing wafer with a wafer handler based on the calculation of the test wafer position. The method may include the step of removing the at least one light source. The at least one light source may be a laser. The at least one light source may be three light sources.

In another aspect, a laser assembly for a wafer processing tool including a laser, a mount for securing the laser to an outer sidewall of a reaction chamber, and wherein the laser projects into the reaction chamber to detect a position of a susceptor within the reaction chamber.

In an implementation, the laser may be removable from the mount. The mount may orient the laser to project through a window in the reaction chamber. The laser may be adjustable in a vertical direction.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve an or all disadvantages noted in any part of this disclosure.

DETAILED DESCRIPTION

The present aspects and implementations may be described in terms of functional block components and various processing steps. Such functional blocks may be realized by any number of hardware or software components configured to perform the specified functions and achieve the various results. For example, the present aspects may employ various sensors, detectors, flow control devices, heaters, and the like, which may carry out a variety of functions. In addition, the present aspects and implementations may be practiced in conjunction with any number of processing methods, and the apparatus and systems described may employ any number of processing methods, and the apparatus and systems described are merely examples of applications of the invention.

Figure 1:
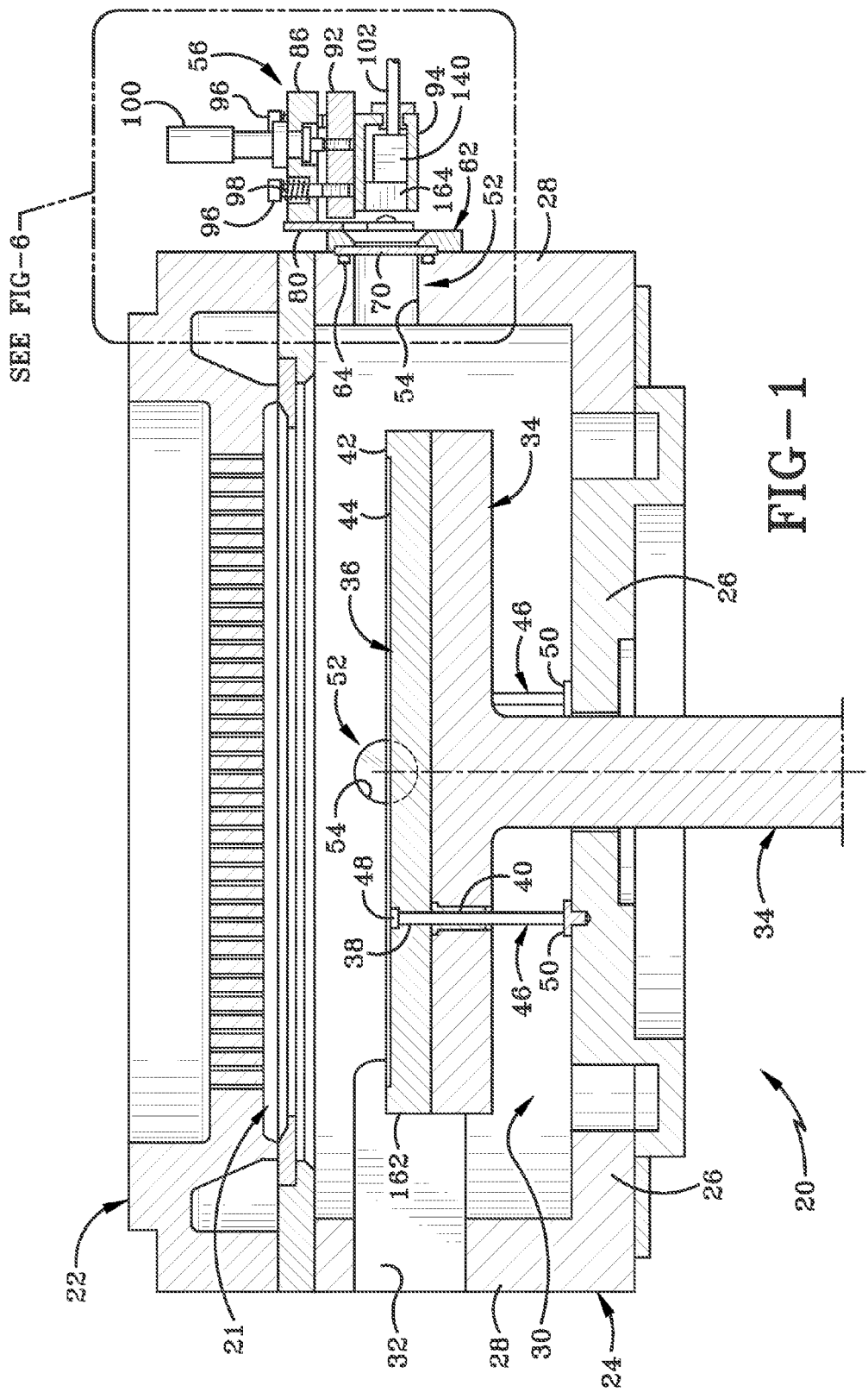
FIG. 1 illustrates a cross-sectional view of a reaction chamber with a light source.

FIG. 1 illustrates a cross-sectional view of reaction chamber 20 having an upper chamber 22, a lower chamber 24, and a reaction space 21 there between. Lower chamber 24 includes a bottom wall 26 and a plurality of side walls 28 extending upward from bottom wall 26. While the current lower chamber 24 includes approximately seven side walls 28, any suitable number of side walls may be incorporated, including a single circular (or any other suitable shape) wall. Bottom walls 26 and side walls 28 together define a wafer loading area 30 in communication with a wafer loading slot 32 in one or more of side walls 28.

A susceptor pedestal 34 extends through bottom wall 26 and into lower chamber 24 to both support and provide vertical movement of susceptor 36. Susceptor 36 is oriented on top of pedestal 34 and supports a wafer (not shown in FIG. 1) for processing. Susceptor 36 and pedestal 34 both include lift pin holes 38, 40 respectively, while susceptor 36 may also include a shoulder 42 and a recess 44 for the positioning of a wafer during processing. Lift pins 46 include a lift pin head 48 for raising a wafer above susceptor recess 44 as necessary. Lift pins 46 operate by contacting a lift pin stop 50 when the pedestal 34 moves downward, thereby limiting the downward travel of lift pins 46 when contacting lift pin stops 50.

FIG. 1 also illustrates a pair of viewing windows 52 in side walls 28 of reaction chamber 20. A plurality of through holes 54 are formed within sidewalls 28 and allow visible and invisible light to pass from outside the reaction chamber and into lower chamber 24. Further, a light source assembly 56 is mounted adjacent viewing windows 52 and through holes 54. While only two viewing windows and through holes are shown in FIG. 1, any suitable number of viewing windows and through holes may be utilized, including but not limited to a single viewing window and through holes, two viewing windows and through holes, three viewing windows and through holes, or even a continuous viewing window extending around the circumference of the reaction chamber. Further, any number of light source assemblies 56 may be incorporated, including but not limited to a single light source assembly 56 at each of the viewing windows 52 and through holes 54, or selectively moving a single light source assembly 56 from one viewing window 52 to another viewing window. Still further, a backup light source assembly 56 may he kept to reduce downtime in the event a light source assembly 56 is damaged, lost, or malfunctioning.

Figure 2:
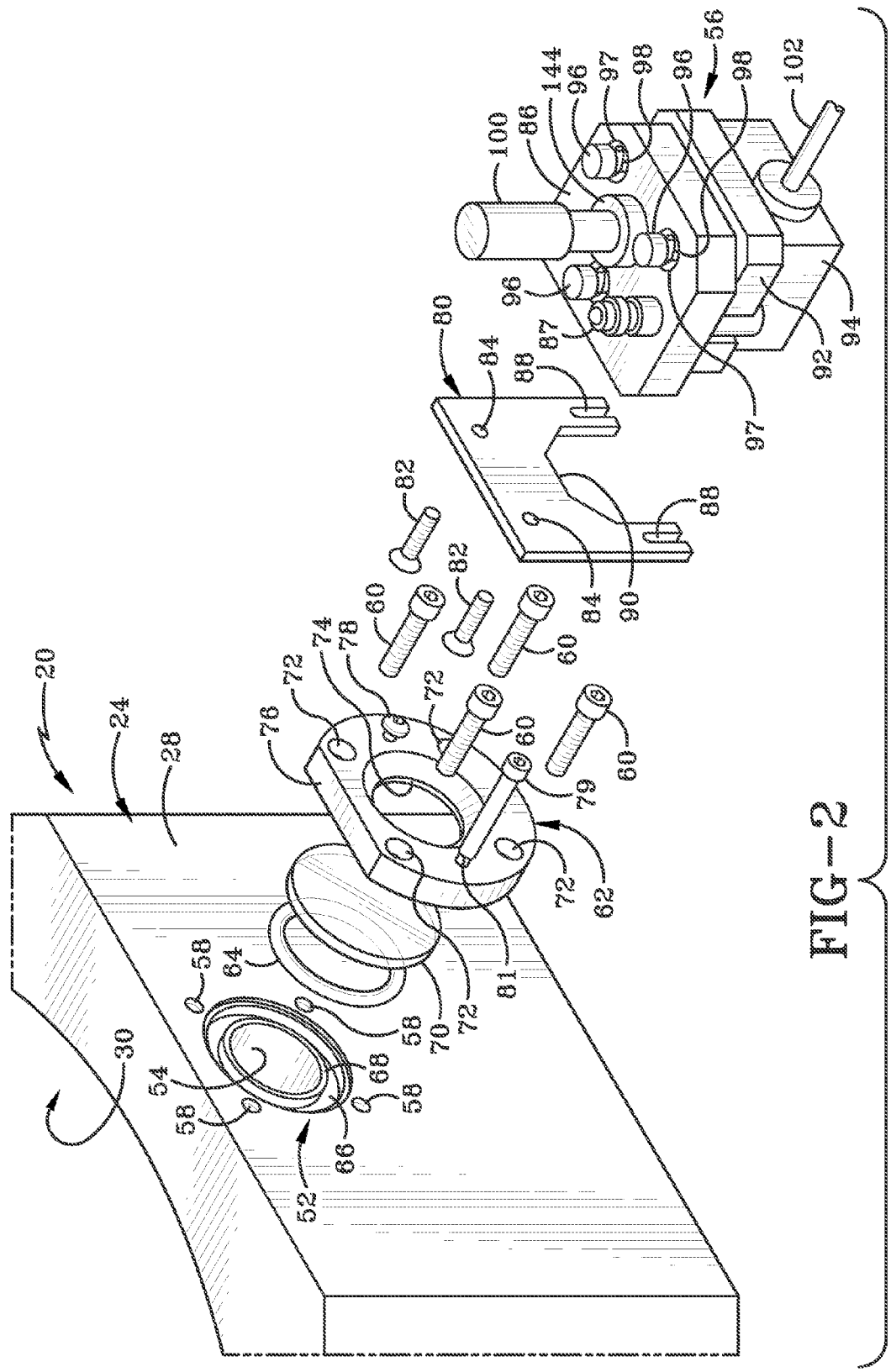
FIG. 2 illustrates an exploded perspective view of the light source attachment at the reaction chamber.

FIG. 2 illustrates an exploded view of light source assembly 56 attached to reaction chamber 20 and particularly side wall 28. Side wall 28 may include a plurality of threaded holes 58 for receiving bolts 60 when securing a mounting spacer 62 to an outer surface of side wall 28 of the reaction chamber 20. Further, a sealing ring 64 or o-ring composed of any suitable material for processing and heat prevention as applicable is positioned within groove 66 surrounding a window ledge 68 adjacent viewing window 52 and through hole 54. A window 70 is positioned adjacent window ledge 68 and seating ring 64 on one side, while mounting spacer 62 contacts the other side of window 70. Window 70 may be composed of any suitable material, including quartz or other process condition safe materials which still permit the passage of a light source there through. In one aspect, window 70 may be replaced as the window is no longer able to transmit the appropriate light there through, at every chamber cleaning, after an interval of a fixed time or number of wafers, or any other suitable metric.

Mounting spacer 62 also includes a plurality of apertures 72 arranged to receive bolts 60 therein to mount the spacer to the side wall 28 at threaded holes 58. The mounting spacer 62 may also include a central hole 74 aligned with window 70 and through hole 54 to permit the light source to shine into and out of reaction chamber 20. A top surface 76 of mounting spacer 62 may be flat to assist with any potential clearance issues between the upper chamber 22 and the lower chamber 24, while a mounting bolt 78 and a shoulder bolt 79 with a shoulder 81 are secured in the mounting spacer 62 to position and secure light source assembly 56 on the reaction chamber during an alignment process.

An alignment spacer 80 may be secured to light source assembly 56 with bolts 82 extending through mounting holes 84 and threading into a top block 86 of light source assembly 56. Alignment spacer 80 may also include a pair of open slots 88 and an opening 90 therein. Open slots 88 are selectively positioned around mounting bolt 78 and shoulder bolt 79 to align and secure the light source assembly 56 to the mounting spacer 62 and the reaction chamber 20 while still allowing for adjustments through the open slots 88 to ensure that the light source assembly 56 is properly setup. Opening 90 may be any suitable size or shape as long as it s aligned with the light source assembly 56 and permits any applicable light to pass through the alignment spacer 80. Each light source assembly 56 may also include an inductive sensor 87 which senses shoulder bolt 79 during operation. Advantageously, inductive sensor 87 ensures that the shoulder bolt 79 is in position and the light source assembly 56 is mounted to a reaction chamber or in the calibration bay in a safe manner to prevent injury to personnel in the area.

Light source assembly 56 also includes a middle block 92, a lower block 94, mounting bolts 96 with springs 98, an adjustment mechanism 100, and a power supply cord 102. The operation, adjustment, and control of light source assembly 56 will be described in greater detail below.

Figure 3:
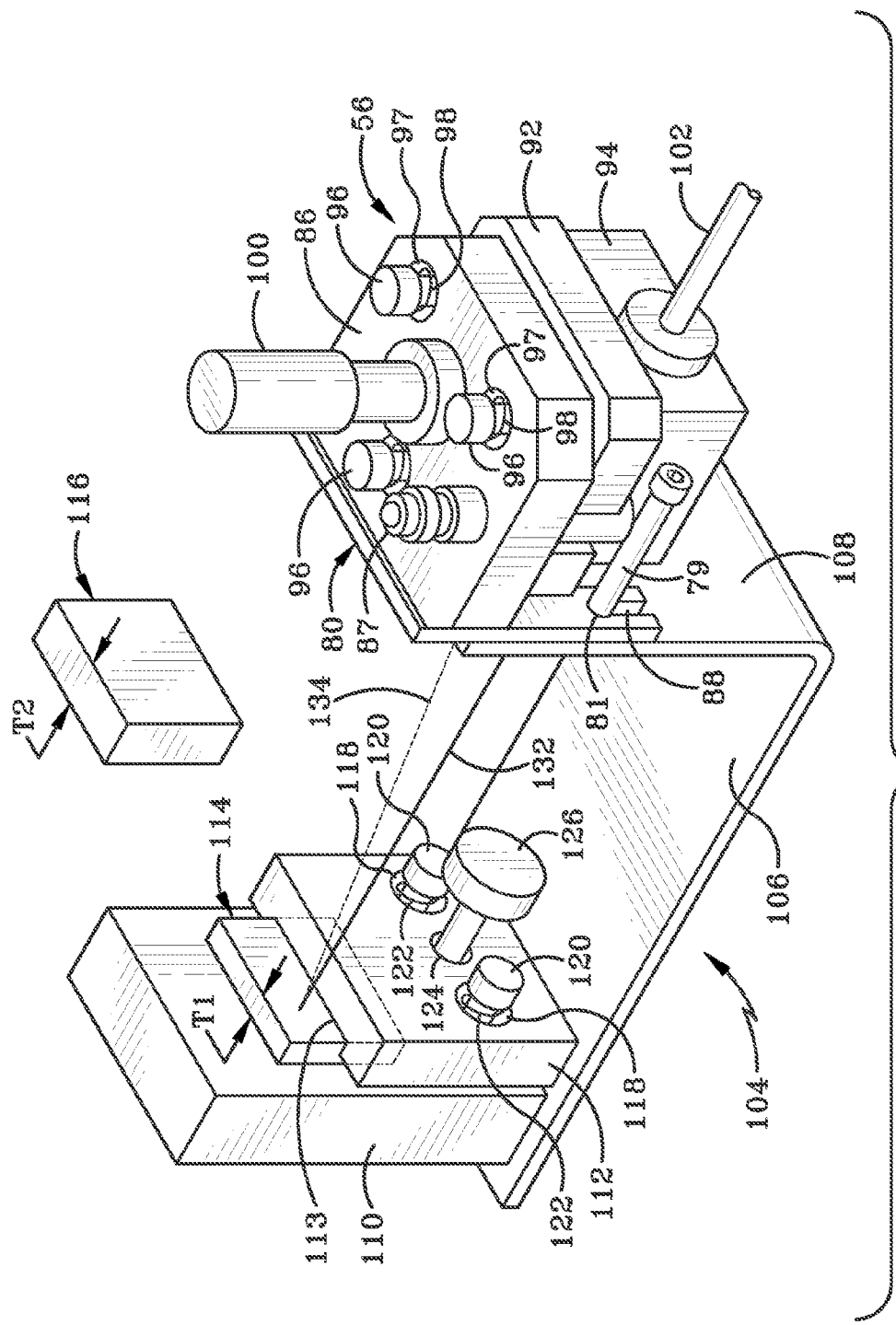
FIG. 3 illustrates a perspective view of a light source alignment device with a light source attached.

Referring now to FIG. 3, light source assembly 56 is shown with alignment spacer 80 attached and both secured to a calibration assembly 104. Calibration assembly 104 includes a base 106 and a light source mounting wall 108 having mounting bolts 109 similar to mounting bolts 78 and shoulder bolt 79 to permit easy installation and removal. A primary mounting block 110 and a secondary mounting block 112 function to removably secure a plurality of calibration blocks 114 and 116 to ensure that the light source assembly 56 is measuring distances properly. Secondary mounting block 112 include a pair of holes 118 for receiving bolts 120 with springs 122, while another hole 124 receives knob 126 to pull secondary mounting block 112 towards light source assembly 56 in order to insert and remove various calibration blocks 114 and 116 during the calibration process. In another aspect, a plurality of protective walls may surround the calibration bay and a pivotable or rotatable lid may open to permit access to the calibration hay and a proximity sensor me be utilized to determine that the lid is in the closed position. These additional walls and components can be used to ensure that the light source assembly 56 is used in a safe manner.

Calibration blocks 114 and 116 each have varying thickness, with calibration block 114 having a thickness $T_1$, while calibration block 116 has at thickness $T_2$. The calibration blocks 114 and 116 each may rest within a slot 113 between blocks 110 and 112 or may be compressively positioned between the blocks if slot 113 is omitted. The thickness of the calibration blocks is important to determine if the light source assembly is emitting light 132 accurately and reflected light 134 properly. The light source assembly 56 operates by emitting light 132 and reading an angle of the reflected light 134 to determine the distance the light has traveled and therefore the distance to the object which reflected the light, the calibration blocks 114 and 116 in this instance. To ensure proper compliance, $T_1$ and $T_2$ must be different to determine that the light source assembly is functioning properly. The operator will load one of the calibration blocks 114,116 by pulling knob 126 in the direction associated with arrow 136 against the pressure of springs 122. The operator will then insert a calibration block between primary block 110 and secondary block 112 within slot 113 and release knob 126 so that the calibration block is aligned with emitting light 132. The light source assembly is powered on and a value is recorded. The first calibration block is then replaced with the second calibration block following the same procedures and the distance to the second calibration block is recorded. Since the operator knows the difference between $T_1$ and $T_2$, the operator can determine if the light source assembly 56 is properly measuring distances, needs adjustment or calibration, or needs to be replaced completely. Advantageously, the use of a simple to mount and dismount calibration assembly 104 allows the operator to ensure the light source assembly 56 is operable before beginning the alignment process at the reaction chamber, thereby saving valuable time.

Figure 4:
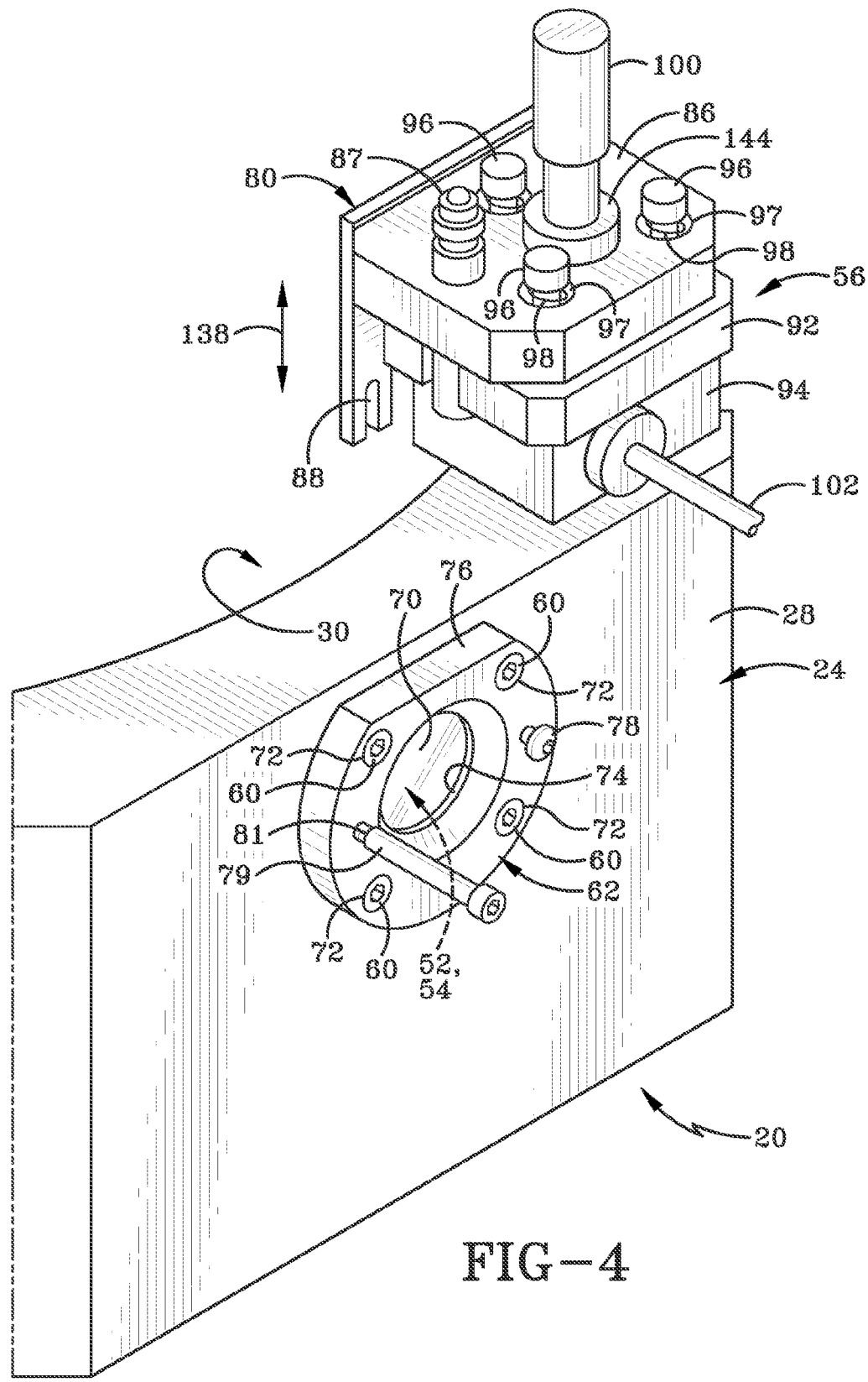
FIG. 4 illustrates a light source being positioned onto the reaction chamber.
Figure 5:
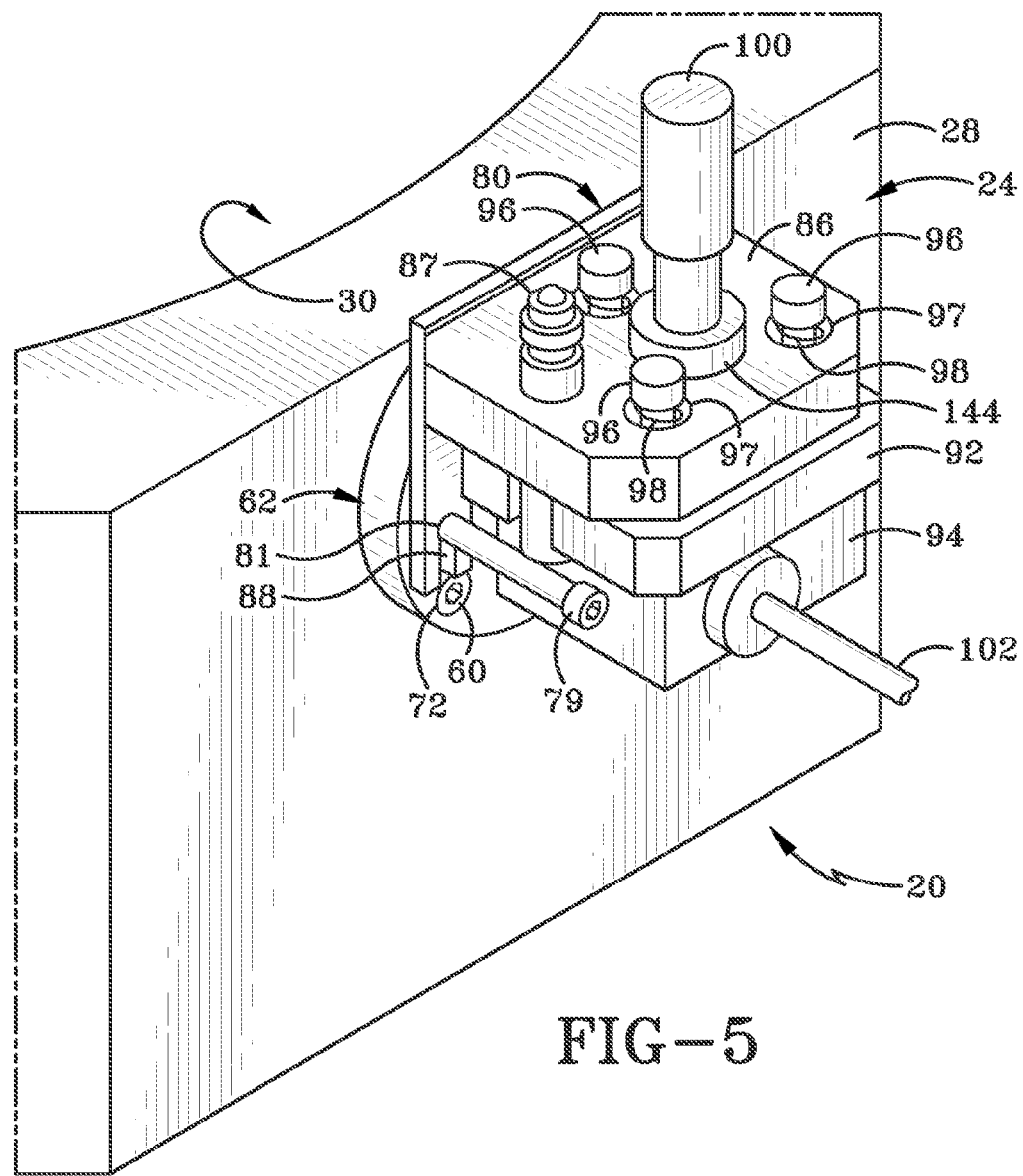
FIG. 5 illustrates a light source positioned on the reaction chamber.

FIGS. 4 and 5 illustrate the mounting of light source assembly 56 to reaction chamber 20. Specially, light source assembly 56 is moved generally vertically in the direction associated with arrows 138 until open slots 88 are positioned on mounting bolt 78 and shoulder bolt 79 of mounting spacer 62. Since the opens slots 88 are generally elongated, they allow for vertical movement in the direction associated with arrows 138. Advantageously, this allows light source assembly 56 to be moved vertically up or down in order to better align the light source assembly 56 with window 70 and provide a more accurate reading within reaction chamber 20. Once the light source assembly 56 is properly aligned, mounting bolt 78 is used as a slight friction fit on one side while shoulder bolt 79 is tightened to secure the light source assembly to the reaction chamber and to prevent additional vertical movement of the light source assembly 56. FIG. 5 illustrates the light source assembly 56 secured to reaction chamber 20 after having been adjusted and shoulder bolt 79 tightened.

Figure 6:
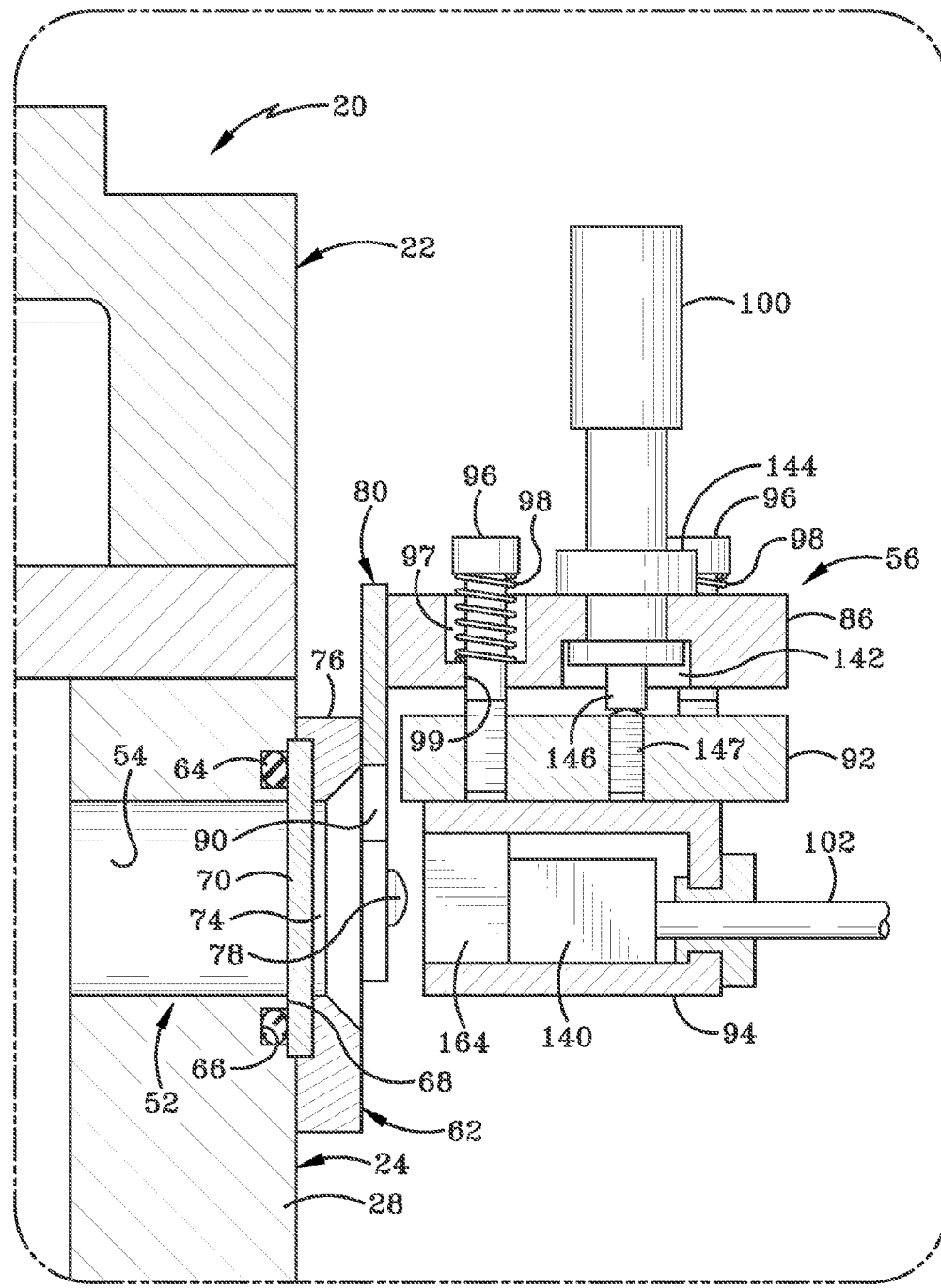
FIG. 6 illustrates a sectional view of the light source and adjustment mechanism.

Referring now to FIG. 6, various internal components of light source assembly 56 are shown in section. Middle block 92 is shown secured to lower block 94 and lower block 94 is shown housing light source 140 which may consist of an emitting laser and a receiver to determine the distance to an object in the reaction chamber using triangulation. Top block 86 includes a through hole 142 for receiving the adjustment mechanism 100 which is mounted to the top block 86 at mount 144. An extendable shaft 146 moves downward as the adjustment mechanism 100 is rotated in a first direction, thereby extending springs 98 and moves upward as the adjustment mechanism is rotated in the opposite direction, compressing springs 98. In this arrangement, the constant bias of springs 98 provides continuous pressure and smooth vertical movement in both directions. In one implementation, the extendable shaft 146 merely pushes the middle block 92 and lower block 94 downwards at a ball bearing set screw 147 and the spring pressure from springs 98 forces the middle and lower blocks back upwards when the extendable shaft 146 is retracted. Specifically, mounting bolts 96 extend through counter bored hole 97 and through hole 99 before threading into middle block 92. Nevertheless, any suitable arrangement may be incorporated, including but not limited to consolidating the middle and lower blocks, removing the lower block altogether, or mourning the light source 140 directly to the top block 86. Further, any suitable method or means of adjusting light source assembly 56 up/down or from side to side may be incorporated so long as the light source assembly 56 is fixed before beginning measurements.

Light source 140 may be a laser, such as a class 2 laser with an emitting laser and a receiving laser having a given sensing range based on the size of the receiving laser window. For example, the emitting laser contacts the object to be sensed and reflects back to the receiving laser window where the return angle is measured to calculate the distance to the pertinent object. As will be discussed below, the process is repeated for various objects to determine the offset position of the object's perimeter for calculating a wafer drop off offset. While the present disclosure refers to a laser for determining the distance to a particular object, any suitable device may be incorporated, whether or not a light source is used. Further, any light source which is used may operate in any applicable spectrum, including but not limited to the visible and invisible spectrums.

Figure 7:
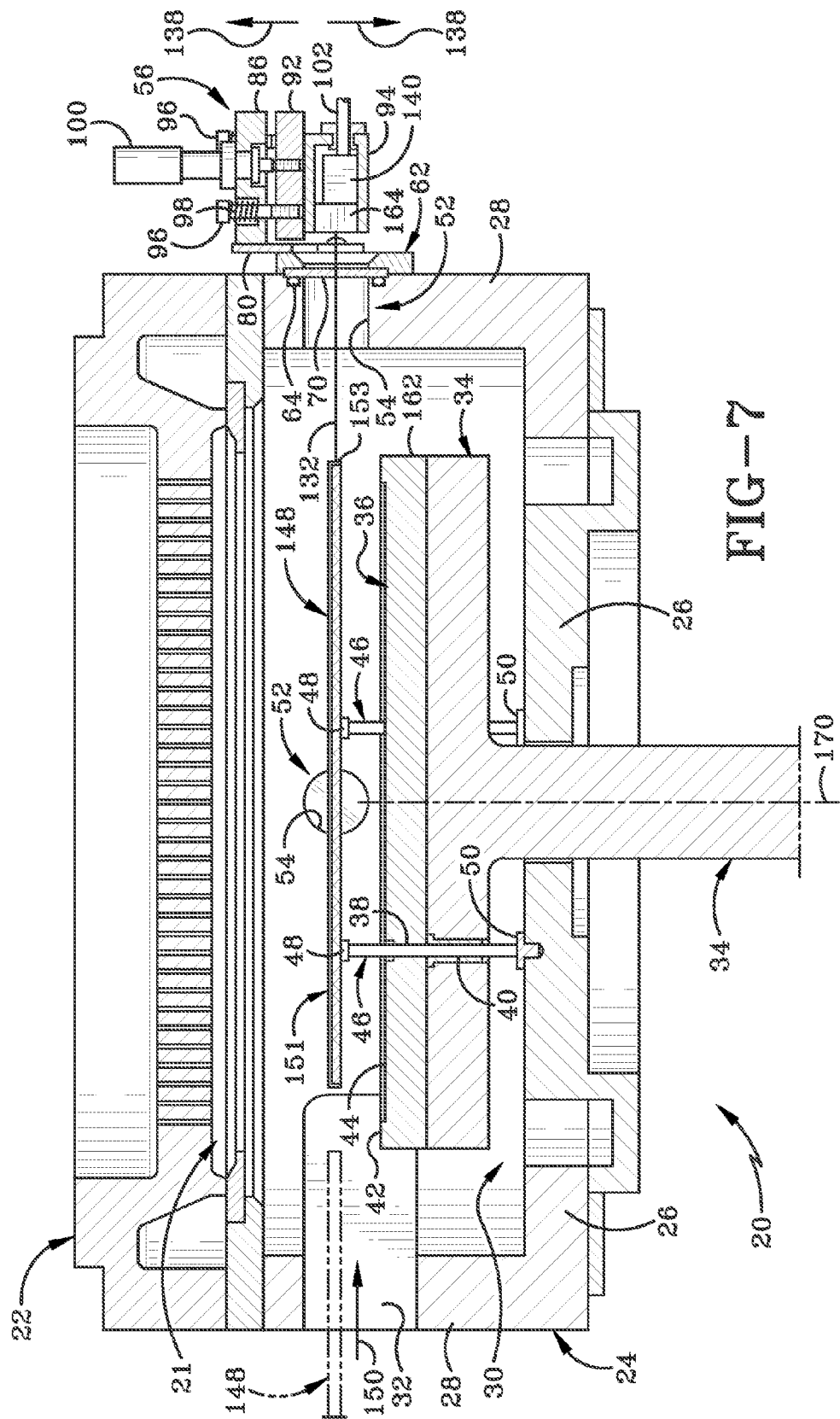
FIG. 7 illustrates a cross-sectional view of the reaction chamber and light source with a wafer mounted on lift pins above the susceptor.
Figure 15:
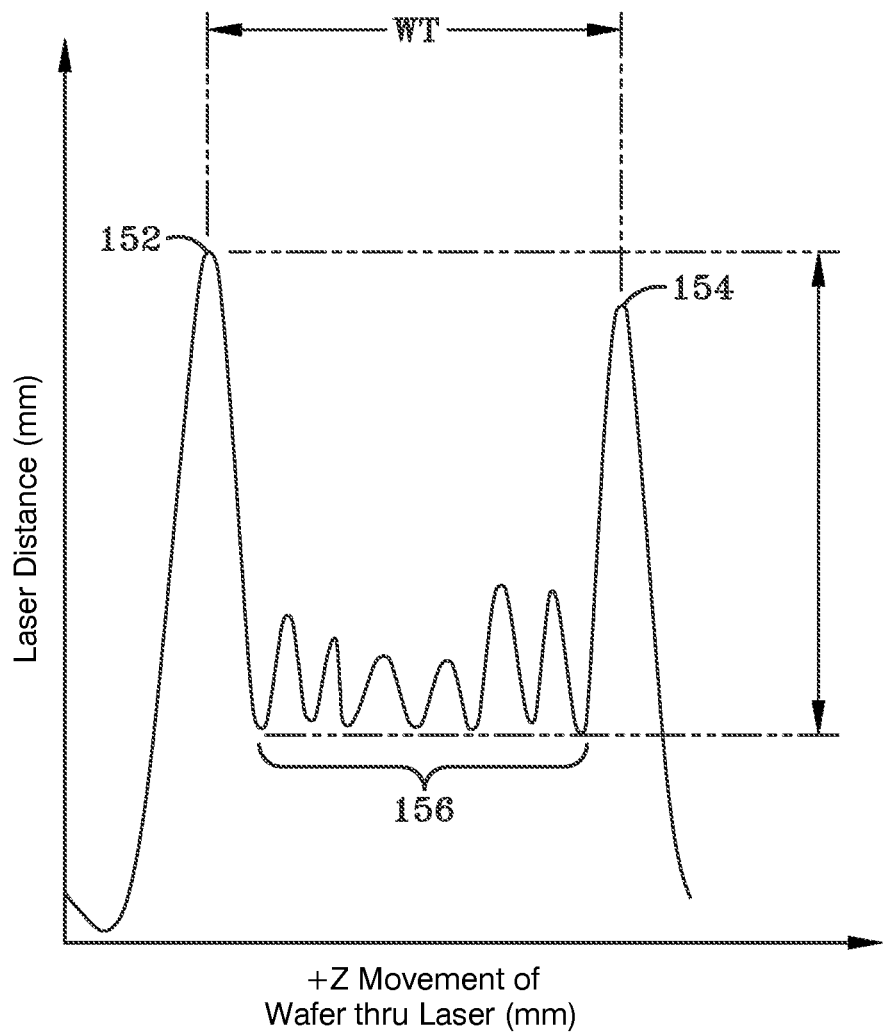
FIG. 15 is a chart illustrating a wafer edge variation as a laser reads positional data throughout the wafer thickness.

FIG. 7 illustrates a wafer 148 being positioned within the reaction chamber 20 in the direction associated with arrow 150. The wafer 148 may include a sharp edge or be composed of a Pyrex wafer which includes a flat periphery to properly reflect the light source during measurements. By flat periphery, it is meant that the top to bottom of the wafer edge or sidewall 153 is generally straight and not curved from the top to the bottom, although any suitable sizes or shapes may be utilized. Further, the wafer 148 may be composed of any suitable reflective material including but not limited to titanium coatings 151 from a PVD sputtered process. The opaque coating 151 is useful to ensure that wafer presence sensors detect the test wafer due to its differing material. However, wafer sidewall 153 may or may not have an opaque coating 151 and still function to reflect an emitted light back to the light source assembly. As the wafer is initially located within the reaction chamber 20, the wafer 148 may be positioned properly or improperly by the robot and is dropped of either directly on the lift pins 46 or onto susceptor 36 after which the susceptor 36 is lowered until lift pins 46 rise to lift the wafer to an appropriate level. It has been shown to be helpful if the setup wafer is positioned on lift pins 46 for the initial locating of light source assembly 56 as detecting an edge of the wafer without accidently detecting the susceptor may be troublesome at times. Once the test wafer 148 is resting on the lift pins, light source assembly 56 is adjusted by operating adjustment mechanism 100 until a central portion of test wafer 146 is aligned with the emitting light 132. Referring briefly to FIG. 15, it is seen that positioning the laser in the middle of the test wafer 148 is more desirable due to large reflectivity losses at the op and bottom edges of the wafer identified as numbers 152 and 154 in FIG. 15. Instead, the best results are obtained by positioning the light source assembly 56 emitting light to read in the middle range 156 of the wafer 148. After the adjustment mechanism 100 has been operated to locate an approximate position within wafer 148 middle range 156, the vertical fine adjustment of light source assembly 56 is completed and the offset measurement process can commence.

Figure 8:
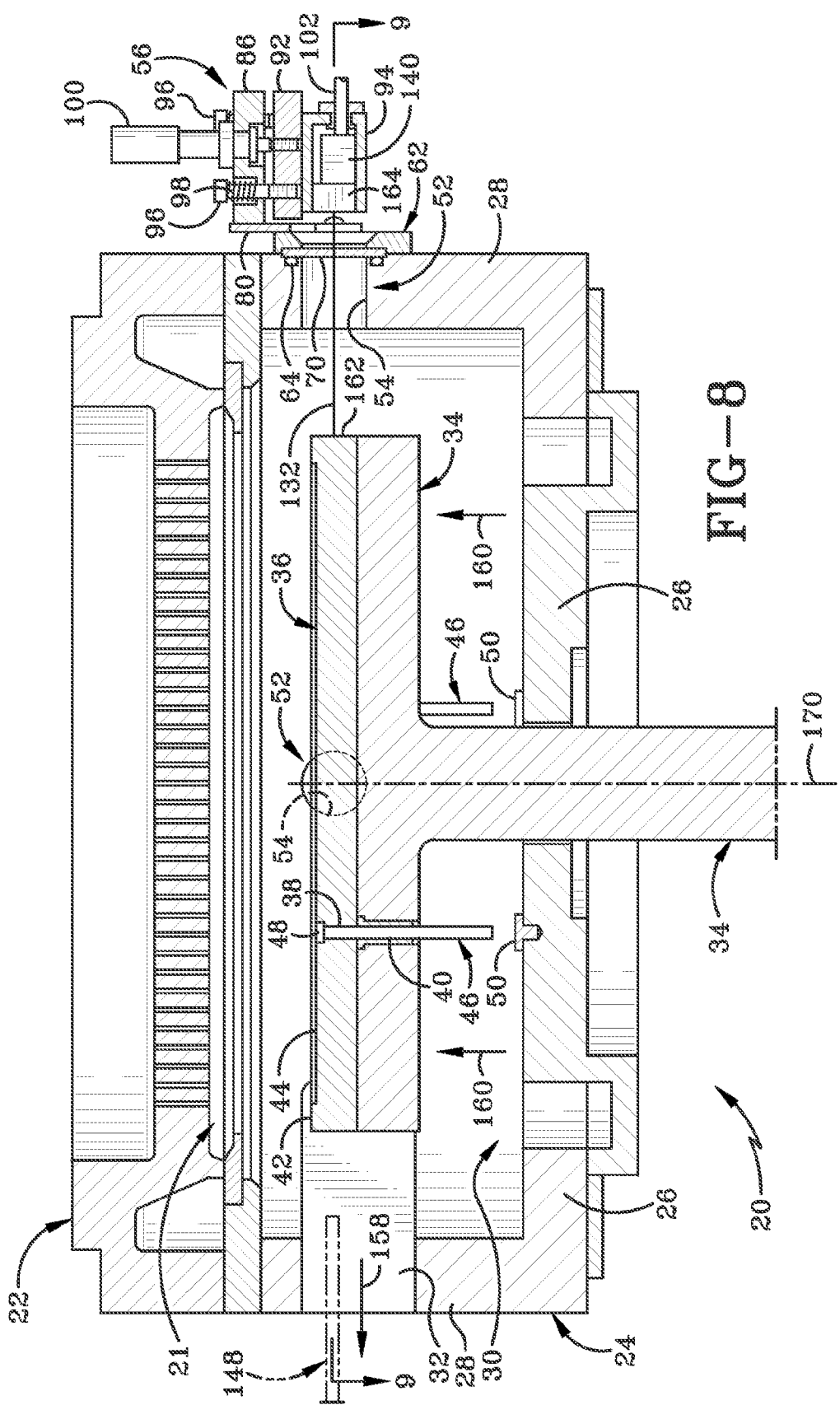
FIG. 8 illustrates a cross-sectional view of the reaction chamber and light source with the wafer removed and the susceptor in a raised position.

FIG. 8 illustrates the next two steps in the disclosed process after the vertical positioning of the light source assembly 56 and the fine adjustment of the adjustment mechanism 100. Specifically, test wafer 148 is removed from the reaction chamber using a robot or other applicable device in the direction associated with arrow 158 through wafer loading slot 32. With the test wafer 148 removed, the susceptor is moved vertically upward in the direction associated with arrows 160 until a side wall 162 of the susceptor is aligned with and crosses emitting light 132 at which time the susceptor vertical movement is stopped. At this time, and even during the initial test wafer alignment for light source assembly 56 discussed above, the reaction chamber is preferably at processing temperatures and pressures. Processing conditions can vary greatly, but can be as high as 600 or even 800 degrees Celsius.

Figure 9:
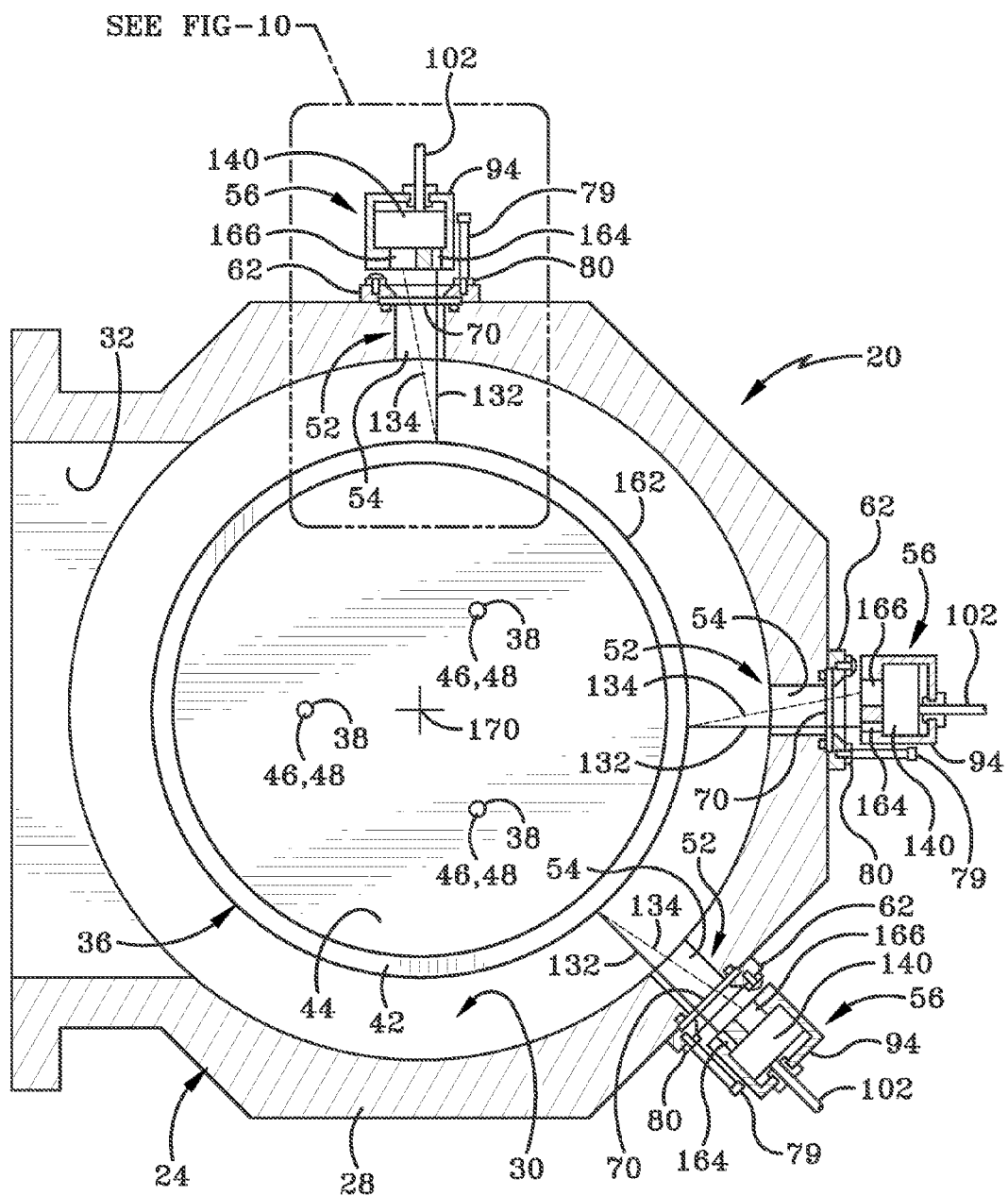
FIG. 9 illustrates a top sectional view of the reaction chamber without a wafer present taken generally about line 9-9 in FIG. 8.
Figure 10:
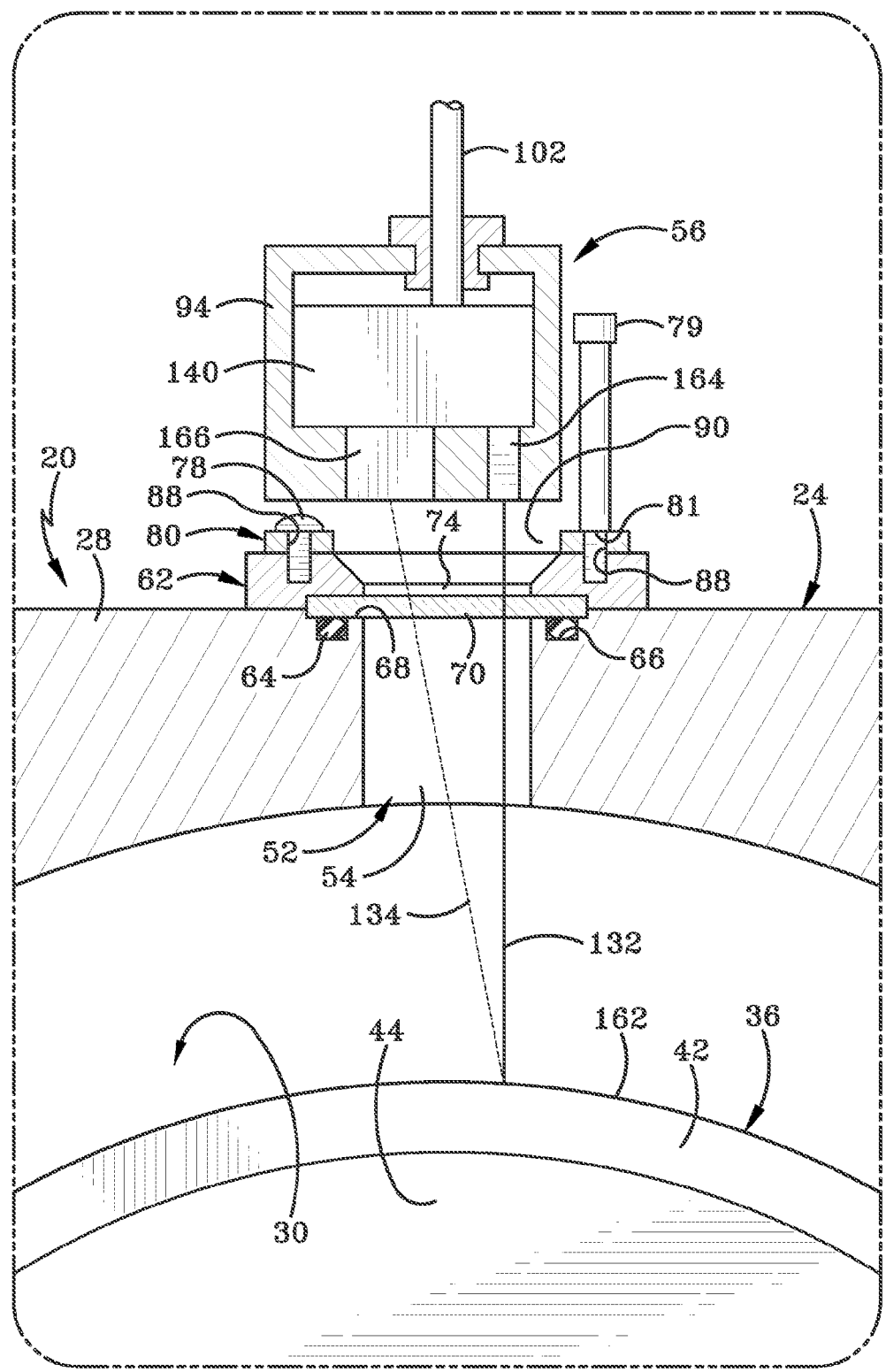
FIG. 10 illustrates a top sectional view of the light source connected to the reaction chamber.

FIGS. 9 and 10 illustrate a top sectional view of FIG. 8 and susceptor 36 positioned in a measuring position where side wall 162 of susceptor 36 intersects emitting light 132 and reflects the light back towards the light source assembly 36 as reflected light 134. As can be seen in greater detail, an emitter light source 164 is positioned adjacent and side-by-side receiving light source 166 in one implementation, although any suitable arrangement may be utilized without departing from the spirit and scope of the disclosure.

As also seen in FIG. 9, any suitable number of light source assemblies 56 may be incorporated around the perimeter of the reaction chamber 20. In one implementation, three light source assemblies are positioned at various locations to provide the distance to the side wall 162 of susceptor 36 at each of the positions shown in FIG. 9. Accordingly, the light sources can be calibrated or zeroed out to define a relative central position with respect to the susceptor. Thus, each of the light source assemblies 56 is zeroed out on side wall 162 of susceptor 36 prior to measuring a distance to a test wafer.

As can be seen in greater detail in FIG. 10, the emitter light source 164 is positioned adjacent one side of through hole 54, while the receiving light source 166 is positioned adjacent an opposite side of through hole 54 to allow enough space for the reflected light 134 to be received in the receiving light source 166. In another implementation, the emitting light 132 can align coincidentally to the susceptor centerline or at a specific offset from the centerline, which may be known to the operator and factored into the offset calculations. By aligning the emitting light 132 offset, the operator may be able to use different or even more accurate light source assemblies.

Figure 11:
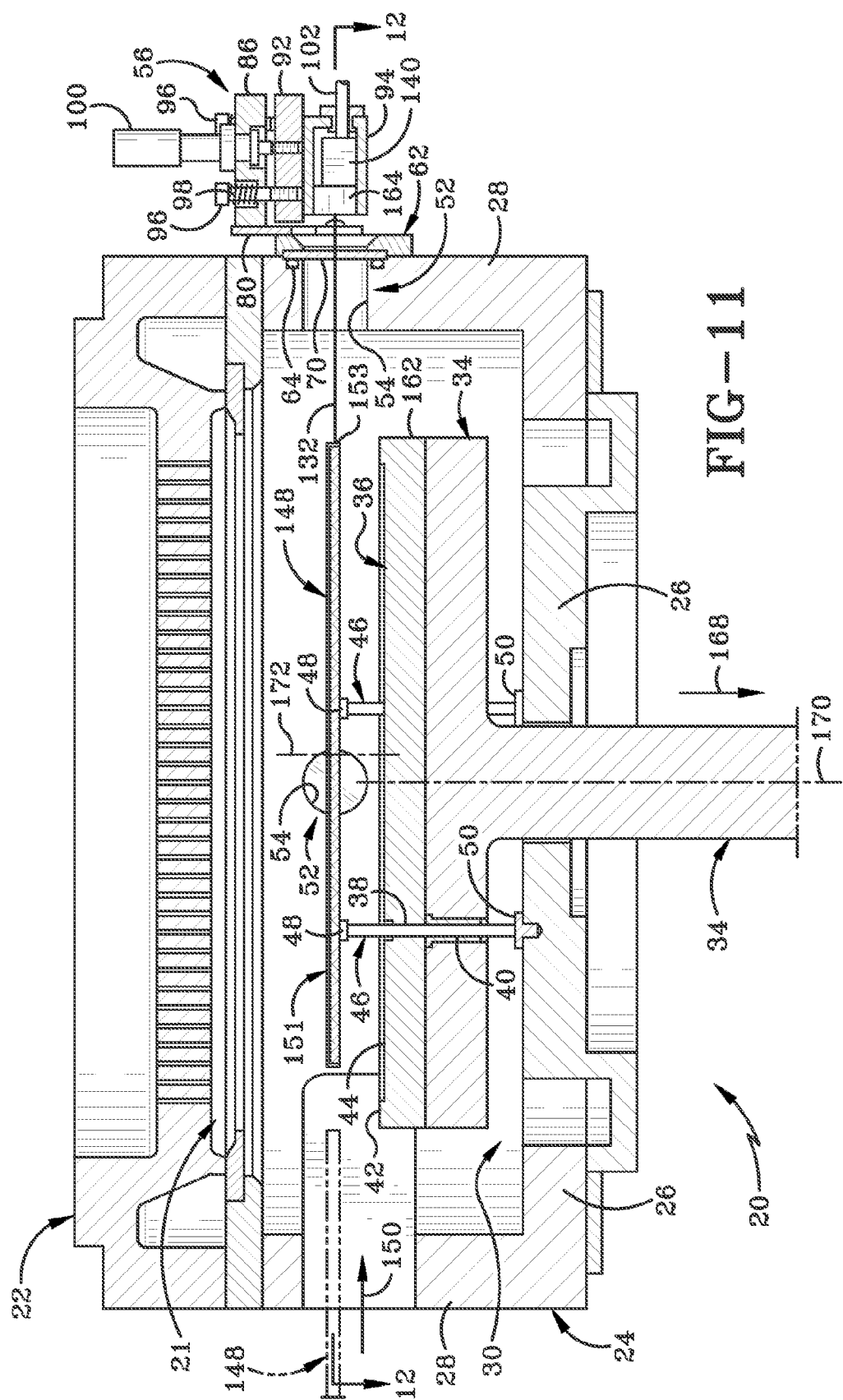
FIG. 11 illustrates a sectional view of the reaction chamber with the light source and a wafer positioned within the reaction chamber in an offset position.

FIG. 11 illustrates the next steps of lowering susceptor 36 in the direction associated with arrow 168 for loading test wafer 148 in the direction associated with arrow 150. Again, the wafer may be loaded directly onto the lift pins or susceptor 36. At this point, test wafer 148 should be intersecting emitting light 132, based on the previous movement of light source assembly 56 shown in FIG. 7. Further, the test wafer 148 loading procedure should be similar if not identical to the proposed wafer processing conditions at wafer load steps. Specifically, the reaction chamber temperature and pressure are closely monitored to obtain process-like conditions for the wafer drop off. Accordingly, FIG. 11 simulates the wafer drop off with any applicable off center position at process dependent temperatures and pressures.

Figure 12:
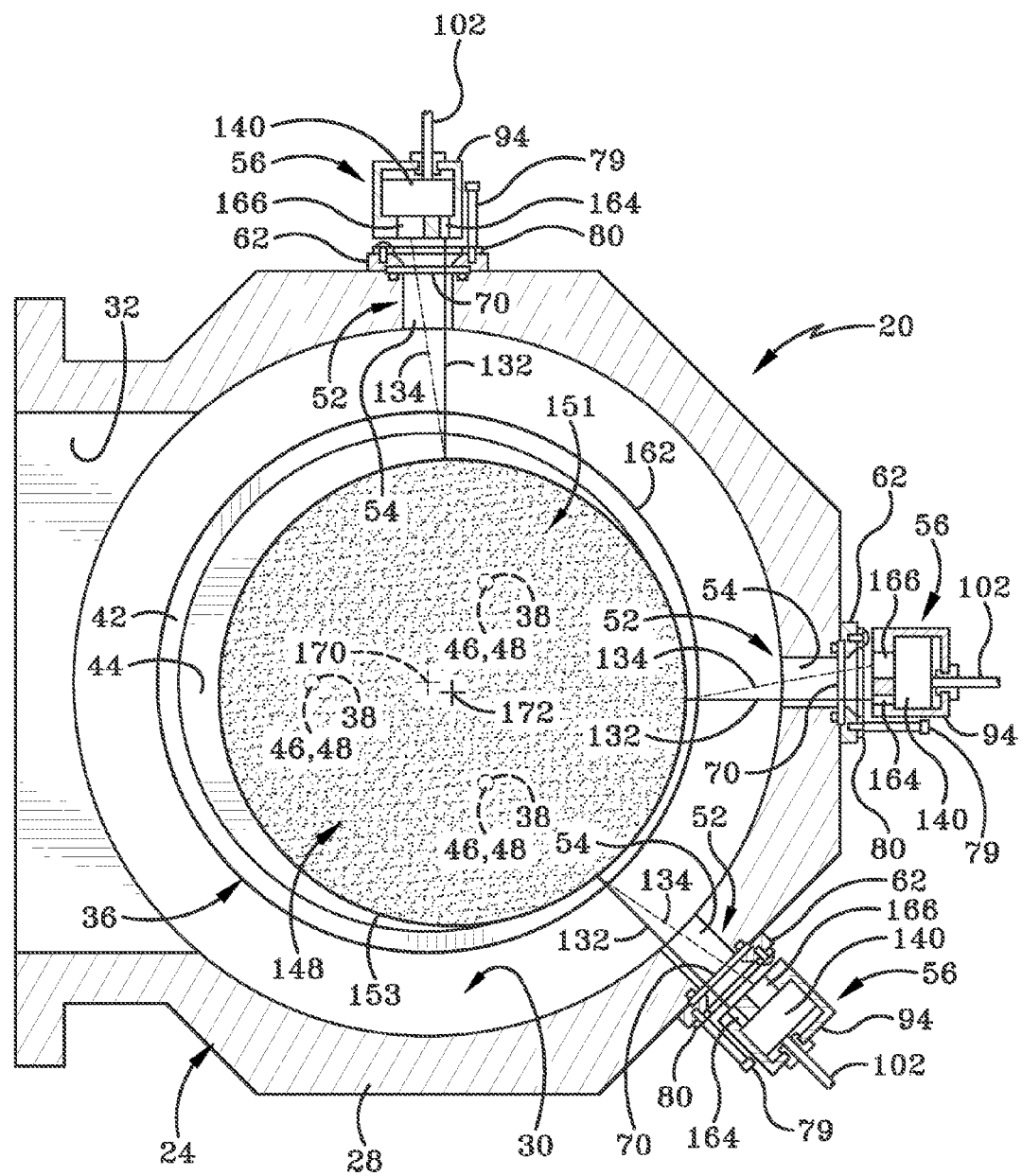
FIG. 12 illustrates a top sectional view of the reaction chamber with the light source connected to the reaction chamber and the wafer in an offset position taken generally about line 12-12 in FIG. 11.

FIG. 12 illustrates the positioning of test wafer 148 after having been dropped off by an end effector (not shown) on lift pins 46. In this case, the test wafer 148 has been positioned offset from the center 170 of susceptor 36, such that test wafer 148 center 172 is an unknown distance at an unknown angle from susceptor center 170. Light source assemblies 56 each provide an emitting light 132 and receive the respective reflected light 134 along three different points of test wafer 148. Using these three points from the zeroed out points of susceptor 36 side wall 162, the operator can determine how far away three particular positions of test wafer 148 are from the susceptor side wall 162 in the same plane. Having determined the offset distances at several points on the wafer and knowing the respective side wall positions, the formulas below can be utilized to determine the distance and angular offset from the susceptor 36 center 170 to the test wafer 148 center 172.

$$X0' = \frac{(X1'^2 + Y1'^2)(Y2' - Y3') + (X2'^2 + Y2'^2)(Y3' - Y1') + (X3'^2 + Y3'^2)(Y1' - Y2')}{2(X1'Y2' - X2'Y1' - X1'Y3' + X3'Y1' + X2'Y3' - X3'Y2')}$$

$$Y0' = \frac{(X1'^2 + Y1'^2)(X3' - X2') + (X2'^2 + Y2'^2)(X1' - X3') + (X3'^2 + Y3'^2)(X2' - X1')}{2(X1'Y2' - X2'Y1' - X1'Y3' + X3'Y1' + X2'Y3' - X3'Y2')}$$

$(X1', Y1') = ((d1)*\text{Cos}(\Theta 10), (d1)*\text{Sin}(\Theta 10))$ $(X2', Y2') = ((d2)*\text{Cos}(\Theta 20), (d2)*\text{Sin}(\Theta 20))$ $(X3', Y3') = ((d3)*\text{Cos}(\Theta 30), (d3)*\text{Sin}(\Theta 30))$ d1=Distance from susceptor to wafer in laser position 1
d2=Distance from susceptor o wafer in laser position 2
d3=Distance from susceptor to wafer in laser position 3
d1=d2=d3 for a perfectly centered wafer
$\Theta 1 = \text{Sin}-1$ (Laser Offset/RSusceptor)
Laser Offset=Laser Offset from Susceptor Centerline
$\Theta 10 = (360° - \Theta 1)$
$\Theta 20 = (360° - \Theta 1 - (\text{Second Laser Position on Chamber})°)$ Θ30=(360°−Θ1—(Third Laser Position on Chamber)°)

Where X and Y are positions, d is the measured distance to the test wafer, and $\Theta_{n0}$ is the angular value for each of the three measurement positions at the light source assemblies 56. After using the formulas above, the operator can determine the offset position and angular offset that is required to properly position the test wafer 148 on the middle of the susceptor to obtain more consistent and favorable processing results at processing temperatures and conditions.

Figure 13:
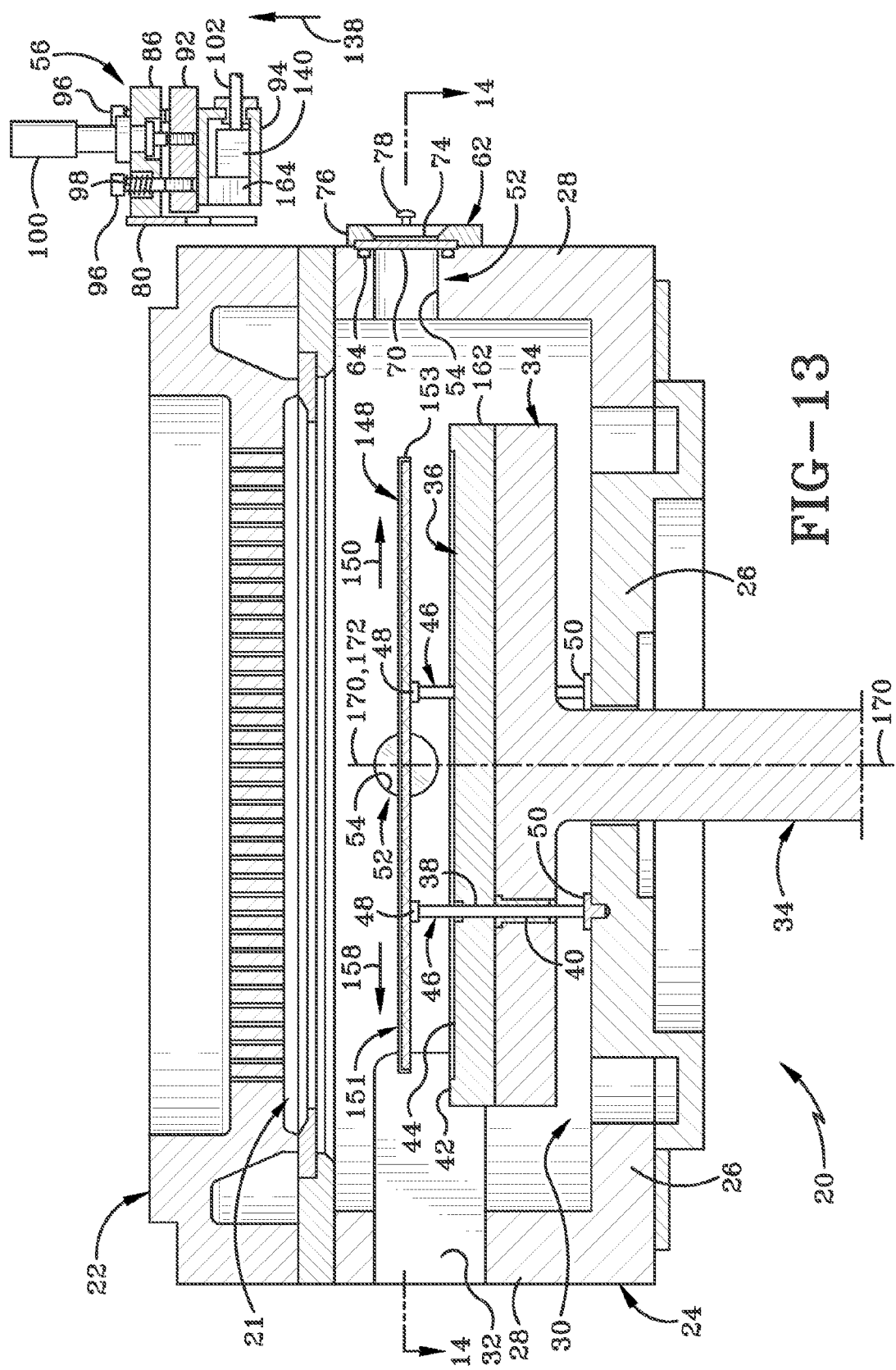
FIG. 13 illustrates a cross-sectional view of the reaction chamber with the light source removed from the reaction chamber and the wafer repositioned in the center of the susceptor while resting on the lift pins.
Figure 14:
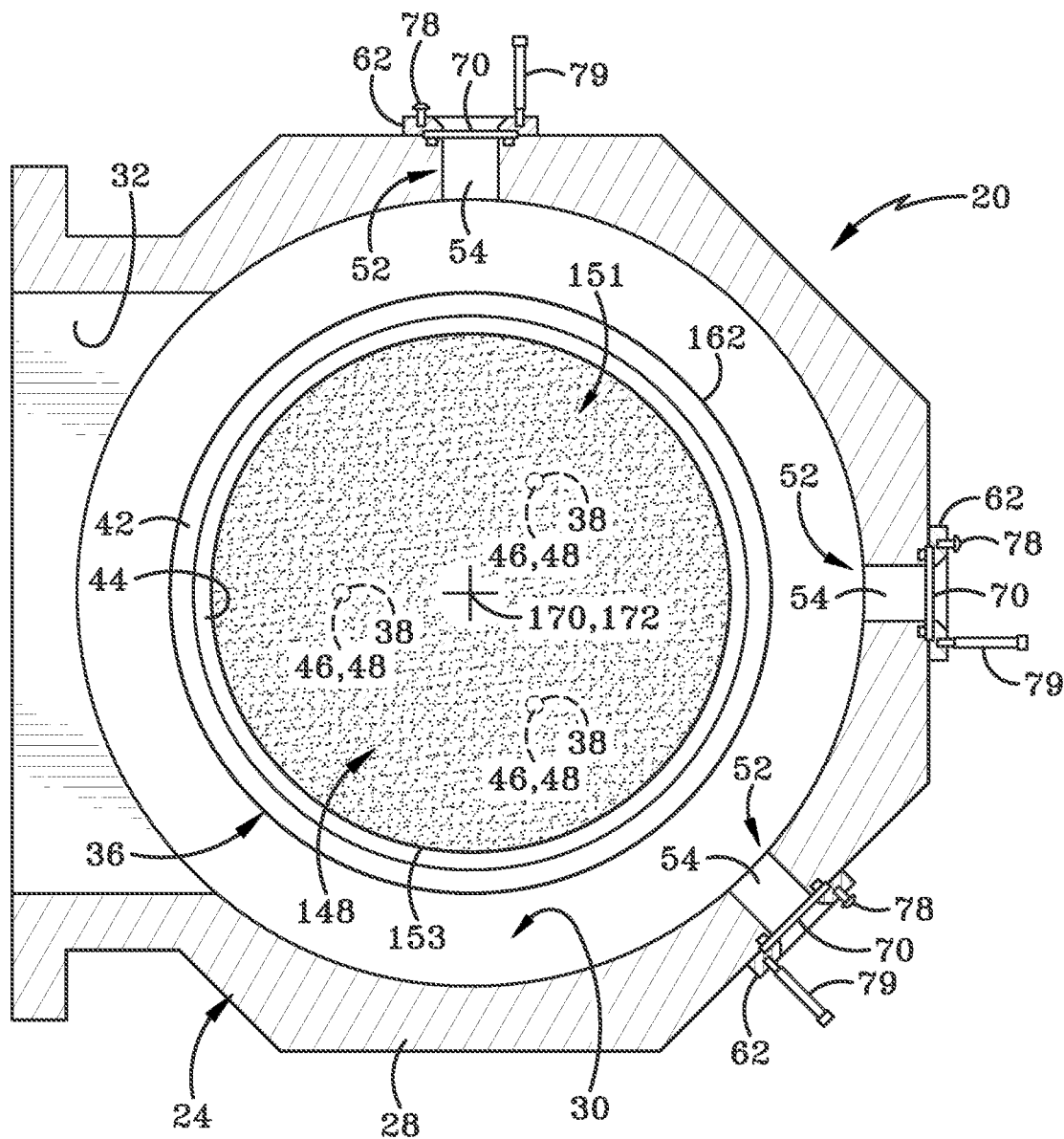
FIG. 14 illustrates a top sectional view of the reaction chamber with the light source removed and a wafer repositioned in the center of the reaction chamber taken generally about line 14-14 in FIG. 13.

FIGS. 13 and 14 illustrate additional optional steps which may be used but are not required to verify the robot or end effector drop off position. Specifically, the test wafer 148 is removed from the chamber and is placed in a transfer chamber or other suitable fixture. The robot or end effector applies the appropriate offset calculation either during the pickup, by picking the wafer up off center, or during the drop off where the end effector positions the test wafer 148 at the new, learned center position on the lift pins or susceptor. The light source assemblies 56 can once again be used to measure the distance to the test wafer 148, whereby light source assembly should read the same distance. If for some reason the light source assemblies 56 do not display reasonably similar values, the calculation process can be repeated to provide another new offset center position and angular offset for redefining the offset drop off or pickup parameters.

FIG. 13 illustrates the light source assemblies 56 being removed from the reaction chamber 20. Advantageously, since the chamber does not need to be opened and the light source assemblies are positioned on the outside of the chamber, they can easily be removed and moved to another chamber for setup under processing conditions. As can be further seen in FIGS. 13 and 14, the mounting hardware for light source assemblies 56 may remain on the reaction chamber 20 during operation and avoids the great deal of time necessary for a heat up and cool down of the chamber while still providing additional positional accuracy since the measurement and testing are done under processing conditions. FIG. 14 goes on to illustrate a wafer, be it test wafer 148 or a production wafer centered on the susceptor 36, thereby allowing greater consistency for processing under conditions similar to those used during the wafer drop off positioning. Accordingly, the light source assemblies 56 are easily transferable between reaction chambers and tools and greatly reduce the wafer drop off position learning time since the chamber can be maintained at processing temperatures and conditions during the setup.

While the present disclosure has generally focused on properly positioning a wafer during wafer drop off in a chamber, the disclosed apparatus and methods may be used to determine the susceptor position at room temperature and various processing temperatures. Further, the concepts can be used to determine the wafer movement in the susceptor after the wafer is picked up by susceptor by lowering the susceptor to position the wafer on the lift pins and determining if there is a change in the wafer position caused by the susceptor. The concepts could be used on each and every wafer during wafer loading to determine if a wafer is within a reasonably acceptable offset tolerance and prevent processing if the wafer is outside of the given processing offset.

These and other embodiments for methods and apparatus for a reaction chamber having light source assemblies for determining a relative position of objects in a reaction chamber therein may incorporate concepts, embodiments, and configurations as described with respect to embodiments of apparatus for measuring devices described above. The particular implementations shown and described are illustrative of the invention and its best mode and are not intended to otherwise limit the scope of the aspects and implementations in any way. Indeed, for the sake of brevity, conventional manufacturing, connection, preparation, and other functional aspects of the system may not be described in detail. Furthermore, any connecting lines shown in the various figures are intended to represent exemplary functional relationships and/or physical couplings between the various elements. Many alternative or additional functional relationship or physical connections may be present in the practical system, and/or may he absent in some embodiments.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

What is claimed is:

1. An apparatus for processing a wafer comprising:
    a reaction chamber having a reaction space for processing the wafer;
    a susceptor positioned within the reaction chamber and having a sidewall;
    at least one light source positioned outside of the reaction space;
    at least one window within a through hole of a sidewall of the reaction chamber; and,
    wherein the at least one light source is directed through the at least one window to contact the sidewall, and
    wherein the at least one light source measures a position of the susceptor sidewall when the susceptor is in a first vertical position and a position of a test wafer sidewall when the susceptor is in a second vertical position.

2. The apparatus for processing a wafer of claim 1 wherein the at least one light source is a laser.

3. The apparatus for processing a wafer of claim 1 wherein the at least one light source is three light sources.

4. The apparatus for processing a wafer of claim 3 wherein the at least one window is three windows.

5. The apparatus for processing a wafer of claim 1 wherein the at least one window is composed of quartz.

6. The apparatus for processing a wafer of claim 1 wherein the at least one light source measures a position of the susceptor sidewall.

7. The apparatus for processing a wafer of claim 1 wherein the at least one light source is mounted on an outer surface of the reaction chamber.

8. The apparatus for processing a wafer of claim 1 wherein the at least one light source is adjustable along a vertical axis.

9. The apparatus for processing a wafer of claim 1 wherein the position of the susceptor sidewall is compared to the position of the test wafer sidewall to define a relative offset.

10. The apparatus for processing a wafer of claim 9 wherein the relative offset is a wafer center point.

11. The apparatus for processing a wafer of claim 10 wherein a wafer handler positions a wafer for processing according to the relative offset.

12. The apparatus for processing a wafer of claim 1 wherein the at least one light source operates when the reaction chamber is at a processing temperature of up to 800° C. to determine a position of the susceptor sidewall at the processing temperature.

13. The apparatus for processing a wafer of claim 1 wherein the at least one light source is removable.

14. The apparatus for processing a wafer of claim 1 wherein the at least one light source is calibrated prior to being mounted on the reaction chamber.

15. The apparatus for processing a wafer of claim 1 further comprising a test wafer, wherein the test wafer is composed of a high opacity material and includes a generally straight sidewall.

16. The apparatus for processing a wafer of claim 1 wherein the test wafer further comprises an opaque top surface.

17. A method of determining a wafer center point comprising the steps of:
    providing a reaction chamber having a reaction space and a sidewall having a through hole with a window therein;
    calibrating at least one light source;
    mounting the at least one light source to the sidewall;
    heating the reaction chamber to a processing temperature;
    activating the at least one light source; and,
    calculating a position of a susceptor,
    wherein the at least one light source measures a position of the susceptor sidewall when the susceptor is in a first vertical position and a position of a test wafer sidewall when the susceptor is in a second vertical position.

18. The method of claim 17 further comprising the steps of:
    moving the susceptor vertically; and,
    activating the at least one light source to calculate a position of a test wafer.

19. The method of claim 18 further comprising the step of calculating a wafer center point from the position of the test wafer and the position of the susceptor.

20. The method of claim 18 further comprising the step of positioning a processing wafer with a wafer handler based on the calculation of the test wafer position.

21. The method of claim 17 further comprising the step of removing the at least one light source.

22. The method of claim 17 wherein the at least one light source is a laser.

23. The method of claim 17 wherein the at least one light source is three light sources.

24. A laser assembly for a wafer processing tool comprising:
    a laser;
    a mount for securing the laser to an outer sidewall of a reaction chamber; and,
    wherein the laser projects through a window within the outer sidewall into the reaction chamber and onto a sidewall of the susceptor to detect a position of a susceptor within the reaction chamber, and
    wherein the laser is used to measure a position of the susceptor sidewall when the susceptor is in a first vertical position and a position of a test wafer sidewall when the susceptor is in a second vertical position.

25. The laser assembly of claim 24 wherein the laser is removable from the mount.

26. The laser assembly of claim 24 wherein the mount orients the laser to project through a window in the reaction chamber.

27. The laser assembly of claim 24 wherein the laser is adjustable in a vertical direction.

28. The apparatus for processing a wafer of claim 1 further comprising an alignment spacer coupled to the sidewall of the reaction chamber.

* * * * *